(12) United States Patent
Seroussi et al.

(10) Patent No.: US 7,624,009 B2
(45) Date of Patent: Nov. 24, 2009

(54) METHOD AND SYSTEM FOR PRODUCING VARIABLE LENGTH CONTEXT MODELS

(75) Inventors: Gadiel Seroussi, Cupertino, CA (US); Sergio Verdu, Princeton, NJ (US); Marcelo Weinberger, San Jose, CA (US); Itschak Weissman, Menlo Park, CA (US); Erik Ordentlich, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 602 days.

(21) Appl. No.: 10/933,793

(22) Filed: Sep. 2, 2004

(65) Prior Publication Data

US 2006/0047501 A1 Mar. 2, 2006

(51) Int. Cl.
*G10L 21/00* (2006.01)
(52) U.S. Cl. ............... 704/228; 707/101; 375/346
(58) Field of Classification Search ................ 704/228
See application file for complete search history.

(56) References Cited

U.S. PATENT DOCUMENTS

| | | | |
|---|---|---|---|
| 6,714,939 B2* | 3/2004 | Saldanha et al. | 707/102 |
| 7,123,172 B1* | 10/2006 | Ordentlich et al. | 341/51 |
| 7,245,241 B2* | 7/2007 | Cai et al. | 341/107 |
| 7,265,692 B2* | 9/2007 | Martin et al. | 341/107 |
| 7,269,781 B2* | 9/2007 | Weissman et al. | 714/780 |
| 7,271,749 B2* | 9/2007 | Weissman et al. | 341/107 |

* cited by examiner

*Primary Examiner*—Susan McFadden

(57) ABSTRACT

Various embodiments of the present invention provide methods and systems for determining, representing, and using variable-length contexts in a variety of different computational applications. In one embodiment of the present invention, a balanced tree is used to represent all possible contexts of a fixed length, where the depth of the balanced tree is equal to the fixed length of the considered contexts. Then, in the embodiment, a pruning technique is used to sequentially coalesce the children of particular nodes in the tree in order to produce an unbalanced tree representing a set of variable-length contexts. The pruning method is selected, in one embodiment, to coalesce nodes, and, by doing so, to truncate the tree according to statistical considerations in order to produce a representation of a variably sized context model suitable for a particular application.

16 Claims, 30 Drawing Sheets

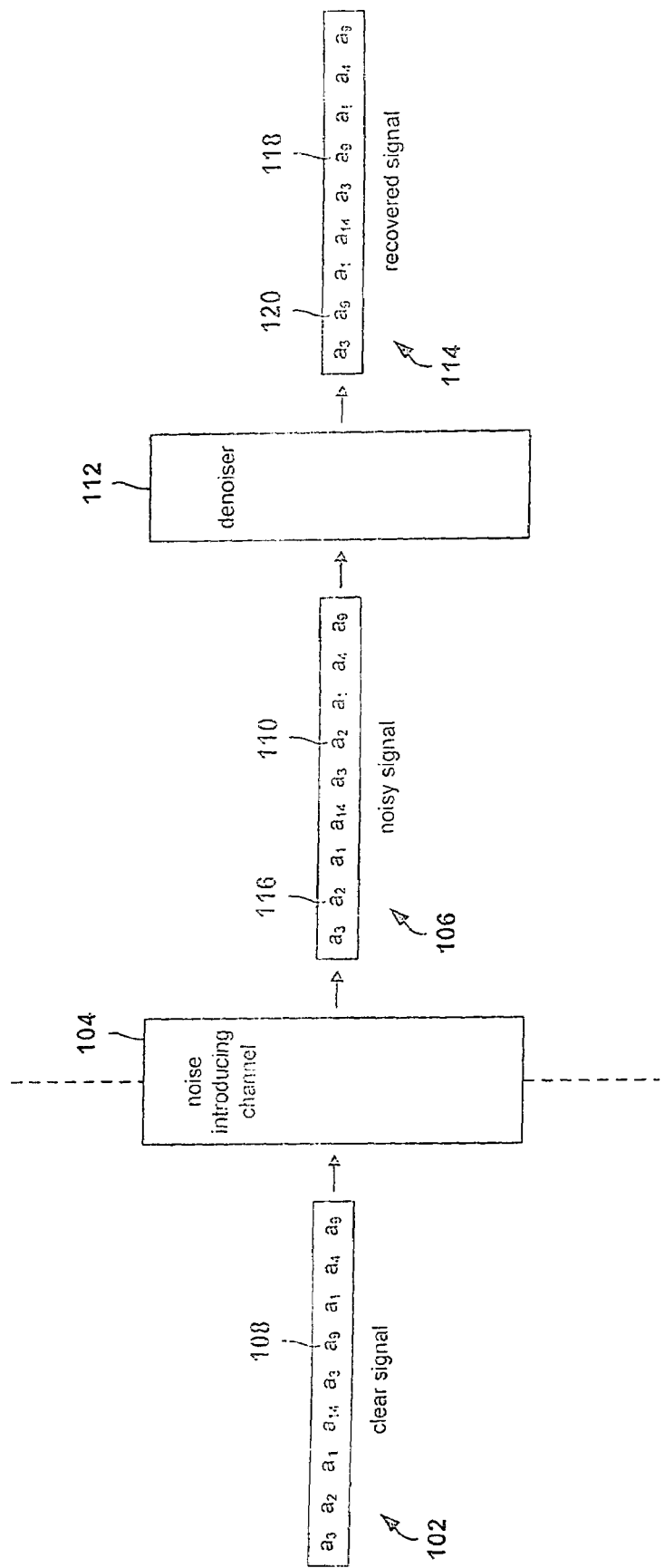

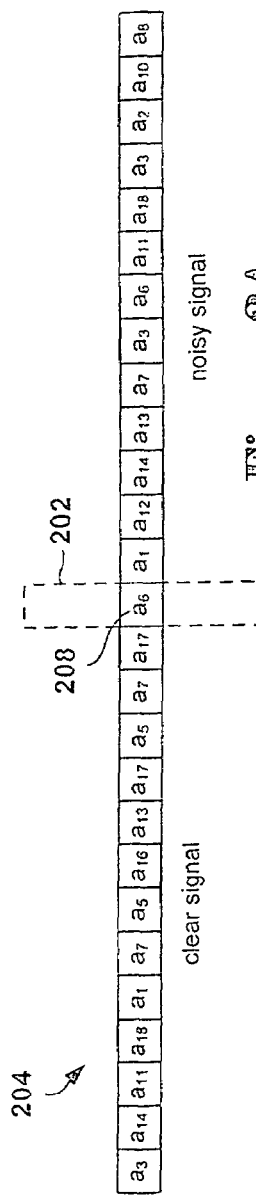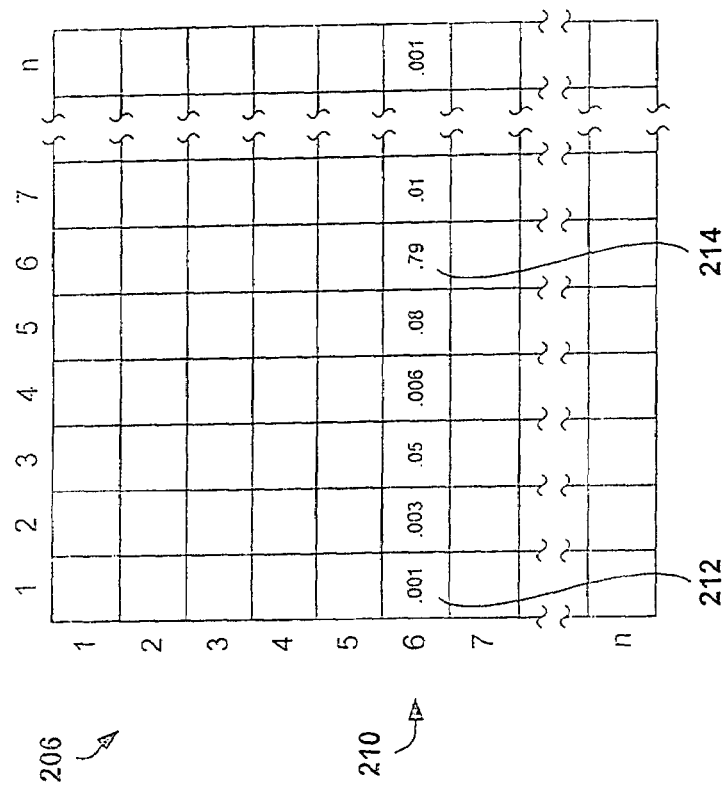
Figure 2A
Figure 2B $$\begin{matrix} \pi_1 & \pi_2 & \pi_3 & \cdots & \pi_n \end{matrix}$$

$$\begin{bmatrix} Pa_1 \rightarrow a_1 & Pa_1 \rightarrow a_2 & Pa_1 \rightarrow a_3 & \cdots & Pa_1 \rightarrow a_n \\ Pa_2 \rightarrow a_1 & Pa_2 \rightarrow a_2 & Pa_2 \rightarrow a_3 & \cdots & Pa_2 \rightarrow a_n \\ Pa_3 \rightarrow a_1 & Pa_3 \rightarrow a_2 & Pa_3 \rightarrow a_3 & \cdots & Pa_3 \rightarrow a_n \\ \vdots & \vdots & \vdots & & \vdots \\ Pa_n \rightarrow a_1 & Pa_n \rightarrow a_2 & Pa_n \rightarrow a_3 & \cdots & Pa_n \rightarrow a_n \end{bmatrix} \; \overset{216}{\swarrow}$$

Figure 2D $$\lambda_1 \quad \lambda_2 \quad \lambda_3 \quad \cdots \quad \lambda_n$$

$$\begin{bmatrix} da_1 \to a_1 & da_1 \to a_2 & da_1 \to a_3 & \cdots & da_1 \to a_n \\ da_2 \to a_1 & da_2 \to a_2 & da_2 \to a_3 & \cdots & da_2 \to a_n \\ da_3 \to a_1 & da_3 \to a_2 & da_3 \to a_3 & \cdots & da_3 \to a_n \\ \vdots & \vdots & \vdots & & \vdots \\ da_n \to a_1 & da_n \to a_2 & da_n \to a_3 & \cdots & da_n \to a_n \end{bmatrix}$$

$$\Lambda$$

Figure 6

$$\begin{bmatrix} da_1 \to a_x \\ da_2 \to a_x \\ \vdots \\ da_n \to a_x \end{bmatrix} \odot \begin{bmatrix} Pa_1 \to a_\alpha \\ Pa_2 \to a_\alpha \\ Pa_3 \to a_\alpha \\ \vdots \\ Pa_n \to a_\alpha \end{bmatrix} = \begin{bmatrix} da_1 \to a_x \; Pa_1 \to a_\alpha \\ da_2 \to a_x \; Pa_2 \to a_\alpha \\ da_3 \to a_x \; Pa_3 \to a_\alpha \\ \vdots \\ da_n \to a_x \; Pa_n \to a_\alpha \end{bmatrix}$$

$$\lambda_{a_x} \quad\quad\quad \pi_{a_\alpha} \quad\quad\quad \lambda_{a_x} \odot \pi_{a_\alpha}$$

Figure 7

$$q^T(S_{noisy}, S_{clear}, b, c) \times \begin{bmatrix} \lambda_{a_x} \odot \pi_{a_\alpha} \end{bmatrix} = \text{distortion expected for replacing } a_\alpha \text{ in } ba_\alpha c \text{ in } S_{noisy} \text{ by } a_x$$

Figure 8

$$m^T(S_{noisy}, b, c) \begin{array}{|c|c|c|c|c|c|} \hline 361 & 7 & 321 & 14 & 81 & 25 \\ \hline \end{array} \times [\Pi^{-1}] = \begin{array}{|c|c|c|c|c|c|} \hline 325 & 18 & 340 & 16 & 41 & 30 \\ \hline \end{array} \ q^T(S_{noisy}, S_{clear}, b, c)$$

Figure 9

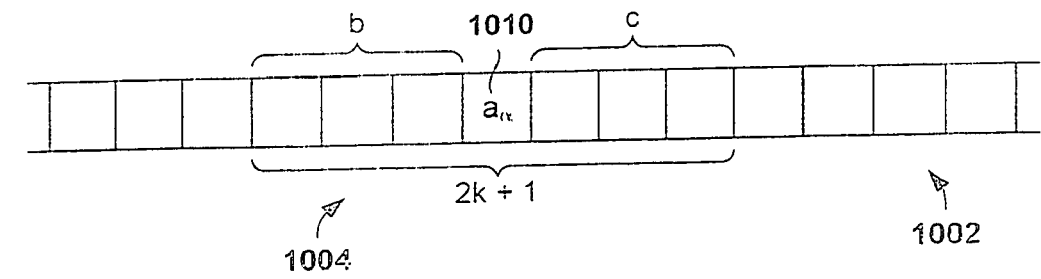
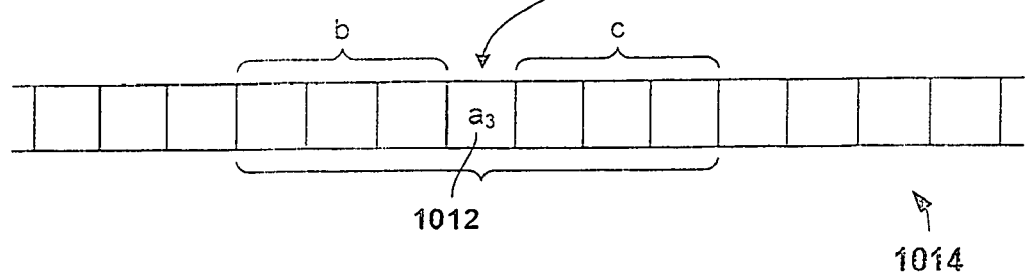
Figure 10 no pruning

| b | c | 0 | 1 |
|---|---|---|---|
| 00 | 00 | 0 | 0 |
| 00 | 01 | 0 | 1 |
| 10 | 00 | 0 | 0 |
| 10 | 01 | 1 | 0 |
| 00 | 10 | 0 | 0 |
| 00 | 11 | 1 | 4 |
| 10 | 10 | 1 | 5 |
| 10 | 11 | 3 | 5 |
| 01 | 00 | 0 | 1 |
| 01 | 01 | 0 | 4 |
| 11 | 00 | 1 | 4 |
| 11 | 01 | 4 | 5 |
| 01 | 10 | 0 | 3 |
| 01 | 11 | 1 | 6 |
| 11 | 10 | 0 | 7 |
| 11 | 11 | 9 | 29 |

← 1502

Figure 15A 4 merges

| b | c | 0 | 1 |
|---|---|---|---|
|   |   |   |   |
| 0 | 0 | 1 | 1 |
| 00 | 1 | 1 | 4 |
| 10 | 10 | 1 | 5 |
| 10 | 11 | 3 | 5 |
| 01 | 00 | 0 | 1 |
| 01 | 01 | 0 | 4 |
| 11 | 00 | 1 | 4 |
| 11 | 01 | 4 | 5 |
| 01 | 10 | 0 | 3 |
| 01 | 11 | 1 | 6 |
| 11 | 10 | 0 | 7 |
| 11 | 11 | 9 | 29 |
|   |   |   |   |
|   |   |   |   |
|   |   |   |   |
|   |   |   |   |

1504

Figure 15B 8 merges

| b | c | 0 | 1 |
|---|---|---|---|
| 0 | 0 | 1 | 1 |
| 00 | 1 | 1 | 4 |
| 10 | 1 | 4 | 10 |
| 01 | 0 | 0 | 5 |
| 11 | 0 | 5 | 9 |
| 01 | 1 | 1 | 9 |
| 11 | 10 | 0 | 7 |
| 11 | 11 | 9 | 29 |

Figure 15C 10 merges

| b | c | 0 | 1 |
|---|---|---|---|
| 0 | 0 | 1 | 1 |
| 0 | 1 | 5 | 14 |
| 1 | 0 | 5 | 14 |
| 01 | 1 | 1 | 9 |
| 11 | 10 | 0 | 7 |
| 11 | 11 | 9 | 29 |
|   |   |   |   |
|   |   |   |   |
|   |   |   |   |
|   |   |   |   |
|   |   |   |   |
|   |   |   |   |
|   |   |   |   |
|   |   |   |   |

Figure 15D 12 merges

| b  | c | 0 | 1  |
|----|---|---|----|
| 0  |   | 6 | 15 |
| 1  | 0 | 5 | 14 |
| 01 | 1 | 1 | 9  |
| 11 | 1 | 9 | 36 |

Figure 15E

METHOD AND SYSTEM FOR PRODUCING VARIABLE LENGTH CONTEXT MODELS

TECHNICAL FIELD

The present invention is related to context models for compression, prediction, and denoising, and, in particular, to a method and system for producing variable-length contexts for various context-model-based applications, including for efficient signal denoising.

BACKGROUND OF THE INVENTION

Context models are employed in a wide variety of different computational applications, including data compression, data prediction algorithms, and methods for denoising discrete digital data, including text data, image data, and other types of data that is stored in electronic media and/or transmitted to remote computers via electronic communications media. In certain applications, fixed length symbol contexts preceding, following, or both preceding and following each symbol in a data stream are considered in order to interpret the symbol. For example, in discrete digital data denoising, preceding and following contexts allow a denoising process to recognize and ameliorate data corruption arising from noise-introducing storage and retrieval and/or noise-introducing transmission. It is conceptually and programmatically easy to consider fixed-length contexts preceding and following a symbol. However, when the occurrences of different symbols within a data stream are non-uniform, it may be advantageous to employ variable-length contexts. Computer scientists, information-theory researchers, and designers, developers, and manufacturers of various computational systems have recognized the need for computationally straightforward and efficient methods for determining, representing, and using variable-length contexts in a wide variety of computational applications.

SUMMARY OF THE INVENTION

Various embodiments of the present invention provide methods and systems for determining, representing, and using variable-length contexts in a variety of different computational applications. In one embodiment of the present invention, a balanced tree is used to represent all possible contexts of a fixed length, where the depth of the balanced tree is equal to the fixed length of the considered contexts. Then, in the embodiment, a pruning technique is used to sequentially coalesce the children of particular nodes in the tree in order to produce an unbalanced tree representing a set of variable-length contexts. The pruning method is selected, in one embodiment, to coalesce nodes, and, by doing so, to truncate the tree according to statistical considerations in order to produce a representation of a variably sized context model suitable for a particular application.

BRIEF DESCRIPTION OF THE DRAWINGS

FIG. 1 illustrates introduction of noise into a clean signal to produce a noisy signal and subsequent denoising of the noisy signal to produce a recovered signal.

FIGS. 2A-D illustrate a motivation for a discrete denoiser related to characteristics of the noise-introducing channel.

FIG. 6 displays one form of the symbol-transformation distortion matrix $\Lambda$.

FIG. 7 illustrates computation of the relative distortion expected from replacing a symbol "$a_\alpha$" in a received, noisy signal by the symbol "$a_x$."

FIG. 8 illustrates use of the column vector $\lambda_{a_x} \odot \pi_{a_\alpha}$ to compute a distortion expected for replacing the center symbol $a_\alpha$ in the metasymbol $ba_\alpha c$ in a noisy signal "$s_{noisy}$" by the replacement symbol $a_x$.

FIG. 9 shows estimation of the counts of the occurrences of symbols "$a_1$"-"$a_n$" for the clean signal.

FIG. 10 illustrates the process by which a discrete denoiser denoises a noisy, received signal.

FIGS. 15A-E show a full, non-variably sized context model and four exemplary variably sized metasymbol occurrence-count vectors, or variably sized context models, generated by different numbers of sequential pruning steps from the fully balanced context tree shown in FIG. 14A.

DETAILED DESCRIPTION OF THE INVENTION

Figure 3A:
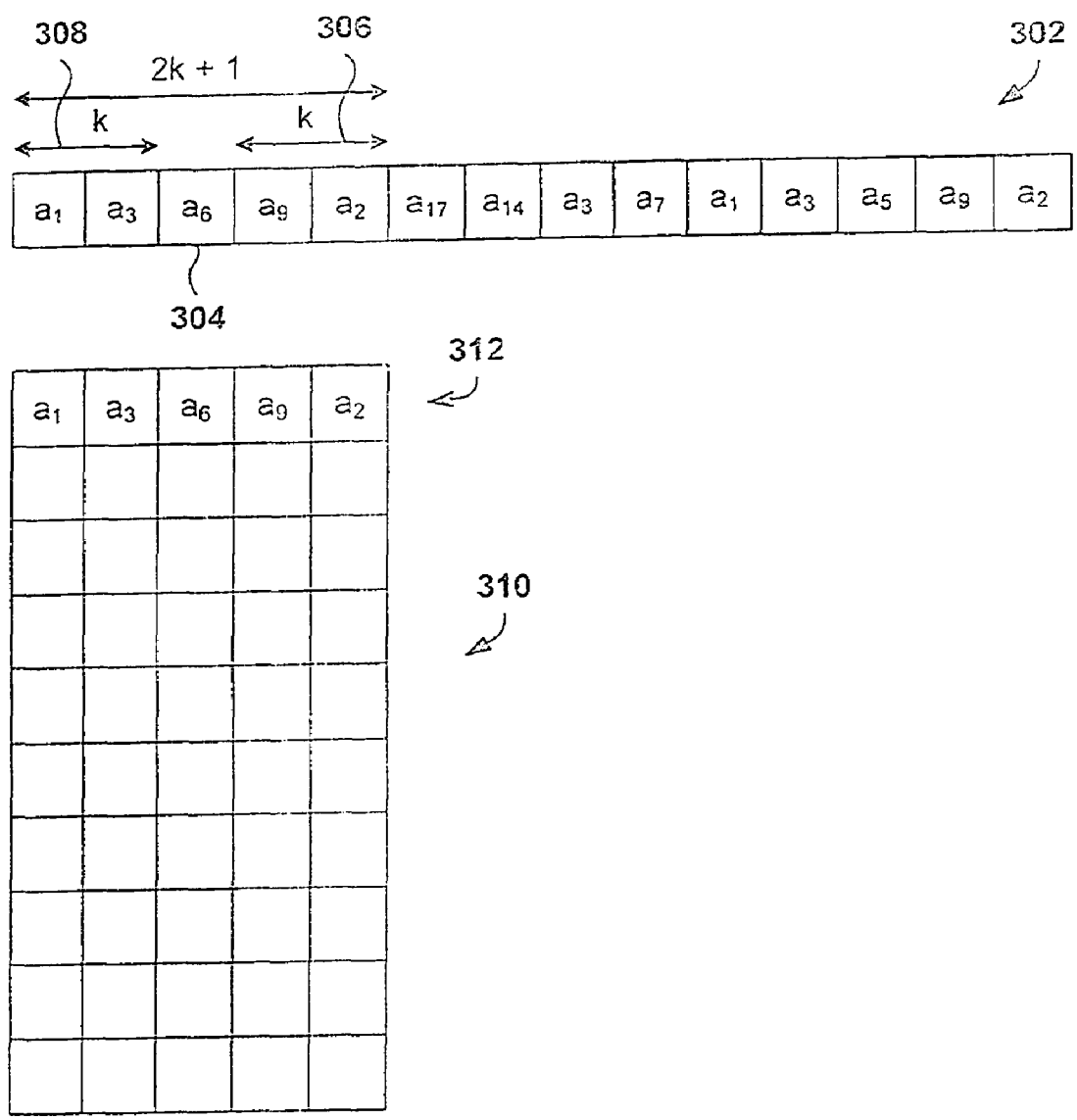
FIGS. 3A-D illustrate a context-based, sliding window approach by which a discrete denoiser characterizes the occurrences of symbols in a noisy signal.

Embodiments of the present invention relate to context models used in compression, prediction, and denoising, and in other areas of computing and computer applications. In a first subsection, below, a discrete denoiser, referred to as the "DUDE," is described. In a second subsection, methods and systems for producing variable-length contexts for various context-model-based applications, including for efficient signal denoising, are discussed.

DUDE

FIG. 1 illustrates introduction of noise into a clean signal to produce a noisy signal and subsequent denoising of the noisy signal to produce a recovered signal. In FIG. 1, signals are represented as sequences of symbols that are each members of an alphabet A having n distinct symbols, where A is:

$$A = (a_1, a_2, a_3, \ldots a_n)$$

Note that the subscripts refer to the positions of the respective symbols within an ordered listing of the different symbols of the alphabet, and not to the positions of symbols in a signal. In FIG. 1, an initial, clean signal 102 comprises an ordered sequence of nine symbols from the alphabet A. In normal circumstances, an input signal would generally have thousands, millions, or more symbols. The short input signal 102 is used for illustrative convenience.

The clean signal 102 is transmitted or passed through a noise-introducing channel 104, producing a noisy signal 106. In the example shown in FIG. 1, the output signal 106 comprises symbols from the same alphabet as the input signal 102, although, in general, the input symbols may be chosen from a different, equally sized or smaller alphabet than that from which the output symbols are selected. In the example shown in FIG. 1, the sixth symbol in the clean signal 108, "$a_9$," is altered by the noise-introducing channel to produce the symbol "$a_2$" 110 in the noisy signal 106. There are many different types of noise-introducing channels, each type characterized by the types and magnitudes of noise that the noise-introducing channel introduces into a clean signal. Examples of noise-introducing channels include electronic communications media, data storage devices to which information is transferred and from which information is extracted, and transmission and reception of radio and television signals. In this discussion, a signal is treated as a linear, ordered sequence of symbols, such as a stream of alphanumeric characters that comprise a text file, but the actual data into which noise is introduced by noise-introducing channels in real world situations may include two-dimensional images, audio signals, video signals, and other types of displayed and broadcast information.

In order to display, broadcast, or store a received, noisy signal with reasonable fidelity with respect to the initially transmitted clean signal, a denoising process may be undertaken to remove noise introduced into the clean signal by a noise-introducing channel. In FIG. 1, the noisy signal 106 is passed through, or processed by, a denoiser 112 to produce a recovered signal 114 which, when the denoising process is effective, is substantially closer to, or more perceptually similar to, the originally transmitted clean signal than to the received noisy signal.

Many types of denoisers have been proposed, studied, and implemented. Some involve application of continuous mathematics, some involve detailed knowledge of the statistical properties of the originally transmitted clean signal, and some rely on detailed information concerning time and sequence-dependent behavior of the noise-introducing channel. The following discussion describes a discrete, universal denoiser, referred to as "DUDE," related to the present invention. The DUDE is discrete in the sense that the DUDE processes signals comprising discrete symbols using a discrete algorithm, rather than continuous mathematics. The DUDE is universal in that it asymptotically approaches the performance of an optimum denoiser employing knowledge of the clean-signal symbol-occurrence distributions without access to these distributions.

The DUDE implementation is motivated by a particular noise-introducing-channel model and a number of assumptions. These are discussed below. However, DUDE may effectively function when the model and assumptions do not, in fact, correspond to the particular characteristics and nature of a noise-introducing channel. Thus, the model and assumptions motivate the DUDE approach, but the DUDE has a much greater range of effectiveness and applicability than merely to denoising signals corrupted by a noise-introducing channel corresponding to the motivating model and assumptions.

As shown in FIG. 1, the DUDE 112 employs a particular strategy for denoising a noisy signal. The DUDE considers each symbol within a context generally comprising one or more symbols preceding and following the symbol according to a left to right ordering. For example, in FIG. 1, the two occurrences of the symbol "$a_2$" in the noisy signal 106 occur within the same single preceding-and-following-symbol context. The full context for the two occurrences of the symbol "$a_2$" in the noisy signal 106 of the example in FIG. 1 is ["$a_3$," "$a_1$"]. The DUDE either leaves all symbols of a particular type "$a_i$" within a particular context unchanged, or changes all occurrences of a particular type of symbol "$a_i$" within a particular context to a different symbol "$a_j$." For example, in FIG. 1, the denoiser has replaced all occurrences of the symbol "$a_2$" 110 and 112 in the noisy signal within the full context ["$a_3$," "$a_1$"] with the symbol "$a_9$" 114 and 116 in the recovered symbol. Thus, the DUDE does not necessarily produce a recovered signal identical to the originally transmitted clean signal, but instead produces a denoised, recovered signal estimated to have less distortion with respect to the clean signal than the noisy signal. In the above example, replacement of the second symbol "$a_2$" 110 with the symbol "$a_9$" 114 restores the originally transmitted symbol at that position, but replacement of the first occurrence of symbol "$a_2$" 112 in the noisy signal with the symbol "$a_9$" 116 introduces a new distortion. The DUDE only replaces one symbol with another to produce the recovered signal when the DUDE estimates that the overall distortion of the recovered signal with respect to the clean signal will be less than the distortion of the noisy signal with respect to the clean signal.

FIGS. 2A-D illustrate a motivation for DUDE related to characteristics of the noise-introducing channel. DUDE assumes a memory-less channel. In other words, as shown in FIG. 2A, the noise-introducing channel 202 may be considered to act as a one-symbol window, or aperture, through which a clean signal 204 passes. The noise-introducing channel 202 corrupts a given clean-signal symbol, replacing the given symbol with another symbol in the noisy signal, with an estimateable probability that depends neither on the history of symbols preceding the symbol through the noise-introducing channel nor on the symbols that are subsequently transmitted through the noise-introducing channel.

FIG. 2B shows a portion of a table 206 that stores the probabilities that any particular symbol from the alphabet A, "$a_i$," may be corrupted to a symbol "$a_j$" during transmission through the noise-introducing channel. For example, in FIG. 2A, the symbol "$a_6$" 208 is currently passing through the noise-introducing channel. Row 210 in table 206 contains the probabilities that symbol "$a_6$" will be corrupted to each of the different, possible symbols in the alphabet A. For example, the probability that the symbol "$a_6$" will be changed to the symbol "$a_1$" 212 appears in the first cell of row 210 in table 206, indexed by the integers "6" and "1" corresponding to the positions of symbols "$a_6$" and "$a_1$" in the alphabet A. The probability that symbol "$a_6$" will be faithfully transferred, without corruption, through the noise-introducing channel 214 appears in the table cell with indices (6, 6), the probability of symbol "$a_6$" being transmitted as the symbol "$a_6$." Note that the sum of the probabilities in each row of the table 206 is 1.0, since a given symbol will be transmitted by the noise-introducing channel either faithfully or it will be corrupted to some other symbol in alphabet A. As shown in FIG. 2C, table 206 in FIG. 2B can be alternatively expressed as a two-dimensional matrix $\Pi$ 216, with the matrix element identified by indices (i, j) indicating the probability that symbol "$a_i$" will be transmitted by the noise-introducing channel as symbol "$a_j$." Note also that a column j in matrix $\Pi$ may be referred to as "$\pi_j$" or $\pi_{a_j}$.

As shown in FIG. 2D, a row vector 218 containing the counts of the number of each type of symbol in the clean signal, where, for example, the number of occurrences of the symbol "$a_5$" in the clean signal appears in the row vector as $m^{clean}[a_5]$, can be multiplied by the symbol-transition-probability matrix $\Pi$ 220 to produce a row vector 222 containing the expected counts for each of the symbols in the noisy signal. The actual occurrence counts of symbols "$a_i$" in the noisy signal appear in the row vector $m^{noisy}$. The matrix multiplication is shown in expanded form 224 below the matrix multiplication in FIG. 2D. Thus, in vector notation:

$$m^{clean}\Pi \cong m^{noisy}$$

where $m^{clean}$ is a row vector containing the occurrence counts of each symbol $a_i$ in alphabet A in the clean signal; and $m^{noisy}$ is a row vector containing the occurrence counts of each symbol $a_i$ in alphabet A in the noisy signal.

The approximation symbol ≅ is employed in the above equation, because the probabilities in the matrix Π give only the expected frequency of a particular symbol substitution, while the actual symbol substitution effected by the noise-introducing channel is random. In other words, the noise-introducing channel behaves randomly, rather than deterministically, and thus may produce different results each time a particular clean signal is transmitted through the noise-introducing channel. The error in the approximation, obtained as the sum of the absolute values of the components of the difference between the left and right sides of the approximation, above, is generally small relative to the sequence length, on the order of the square root of the sequence length. Multiplying, from the right, both sides of the above equation by the inverse of matrix Π, assuming that Π is invertible, allows for calculation of an estimated row-vector count of the symbols in the clean signal, $\hat{m}^{clean}$, from the counts of the symbols in the noisy signal, as follows:

$$\hat{m}^{clean} = m^{noisy}\Pi^{-1}$$

In the case where the noisy symbol alphabet is larger than the clean symbol alphabet, it is assumed that Π is full-row-rank and the inverse in the above expression can be replaced by a generalized inverse, such as the Moore-Penrose generalized inverse.

As will be described below, the DUDE applies clean symbol count estimation on a per-context basis to obtain estimated counts of clean symbols occurring in particular noisy symbol contexts. The actual denoising of a noisy symbol is then determined from the noisy symbol's value, the resulting estimated context-dependent clean symbol counts, and a loss or distortion measure, in a manner described below.

As discussed above, the DUDE considers each symbol in a noisy signal within a context. The context may be, in a 1-dimensional signal, such as that used for the example of FIG. 1, the values of a number of symbols preceding, following, or both preceding and following a currently considered signal. In 2-dimensional or higher dimensional signals, the context may be values of symbols in any of an almost limitless number of different types of neighborhoods surrounding a particular symbol. For example, in a 2-dimensional image, the context may be the eight pixel values surrounding a particular, interior pixel. In the following discussion, a 1-dimensional signal is used for examples, but higher dimensional signals can be effectively denoised by the DUDE.

In order to consider occurrences of symbols within contexts in the 1-dimensional-signal case, the DUDE needs to consider a number of symbols adjacent to each, considered symbol. FIGS. 3A-D illustrate a context-based, sliding window approach by which the DUDE characterizes the occurrences of symbols in a noisy signal. FIGS. 3A-D all employ the same illustration conventions, which are described only for FIG. 3A, in the interest of brevity. In FIG. 3A, a noisy signal 302 is analyzed by DUDE in order to determine the occurrence counts of particular symbols within particular contexts within the noisy signal. The DUDE employs a constant k to describe the length of a sequence of symbols preceding, and the length of a sequence of symbols subsequent to, a particular symbol that, together with the particular symbol, may be viewed as a metasymbol of length 2k+1. In the example of FIGS. 3A-D, k has the value "2." Thus, a symbol preceded by a pair of symbols and succeeded by a pair of symbols can be viewed as a five-symbol metasymbol. In FIG. 3A, the symbol "$a_6$" 304 occurs within a context of the succeeding k-length symbol string "$a_9a_2$" 306 and is preceded by the two-symbol string "$a_1a_3$" 308. The symbol "$a_6$" therefore occurs at least once in the noisy signal within the context ["$a_1a_3$," "$a_9a_2$"], or, in other words, the metasymbol "$a_1a_3a_6a_9a_2$" occurs at least once in the noisy signal. The occurrence of this metasymbol within the noisy signal 302 is listed within a table 310 as the first five-symbol metacharacter 312.

Figure 3B:
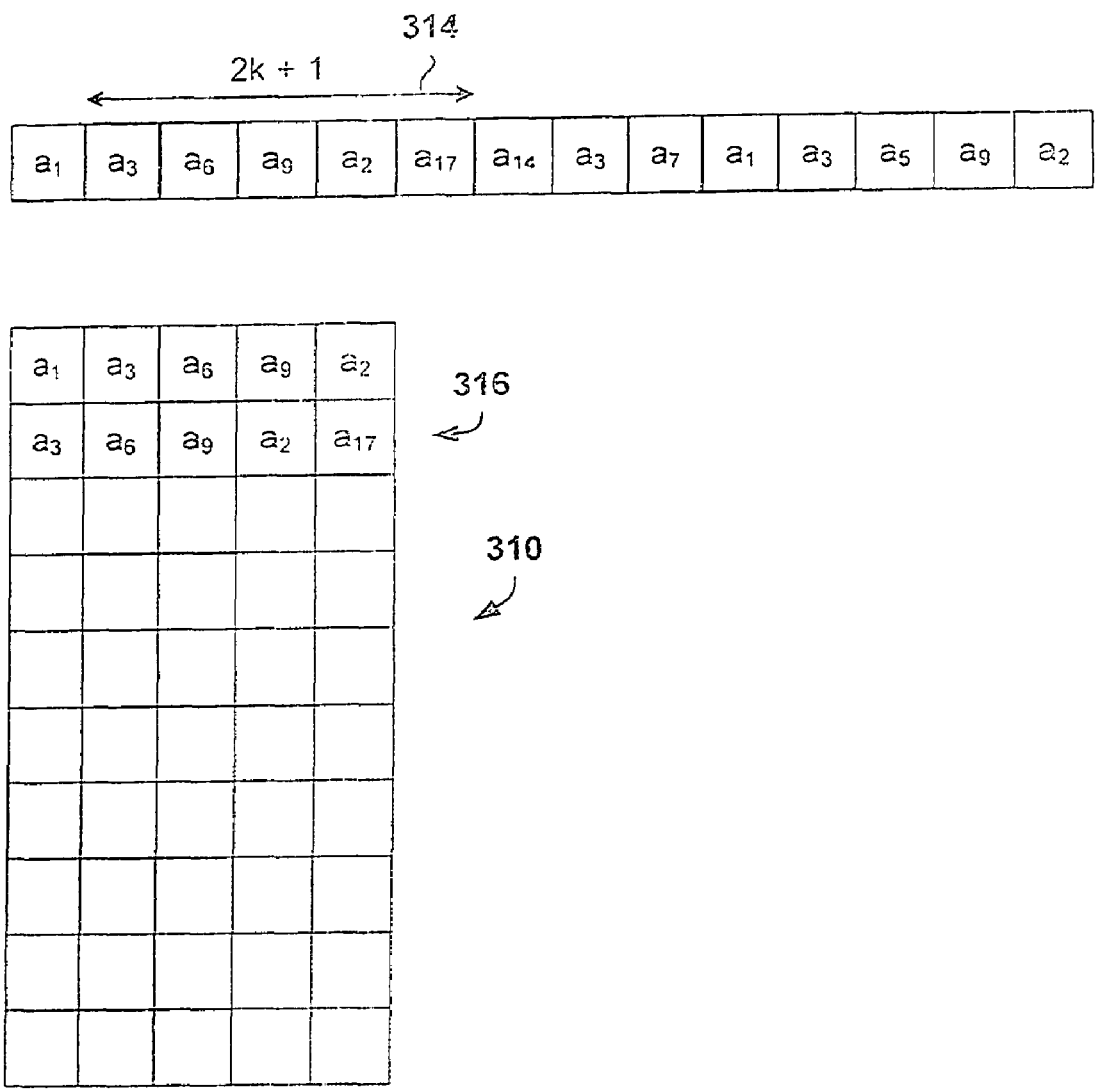
Figure 3C:
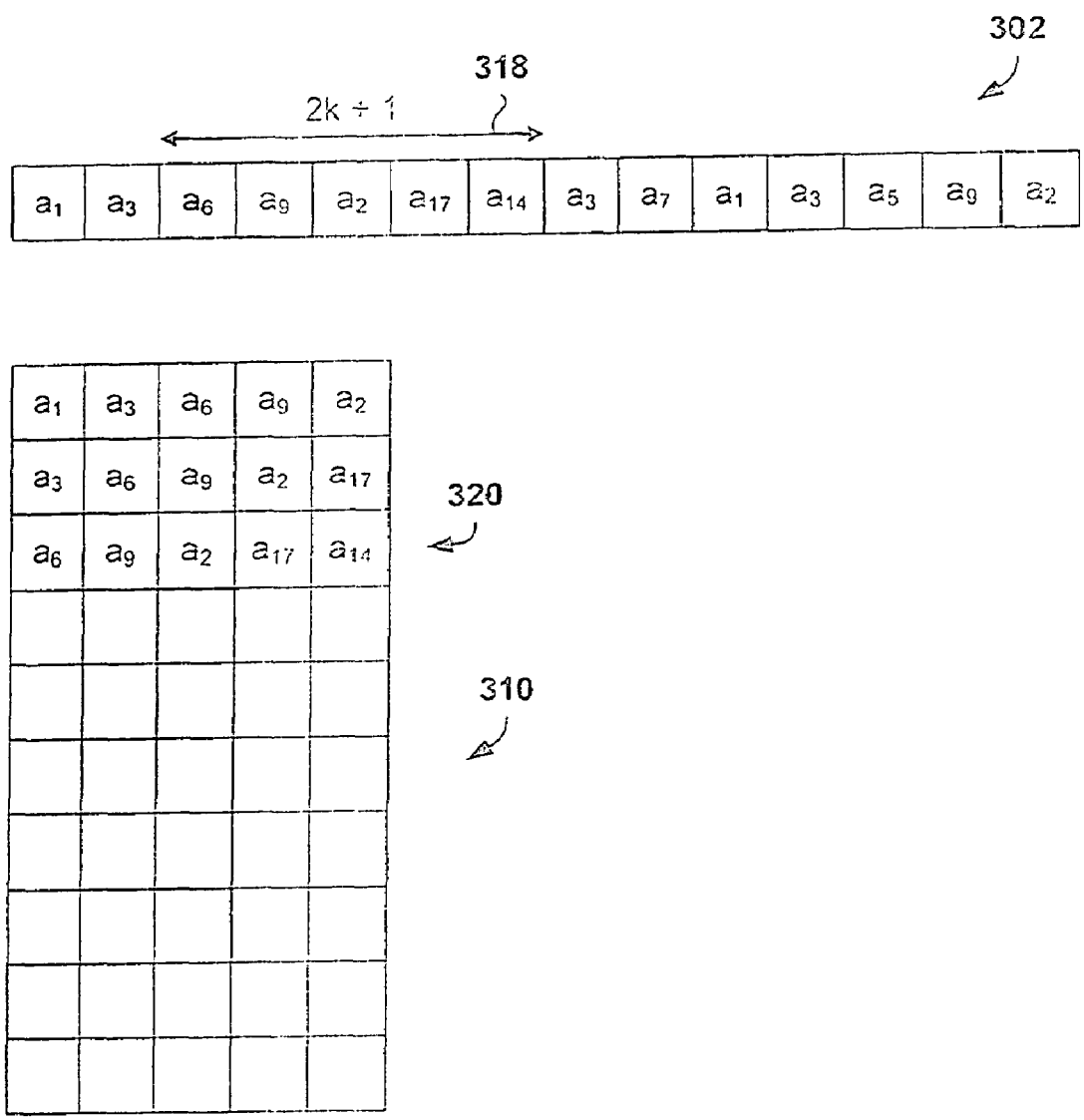
Figure 3D:
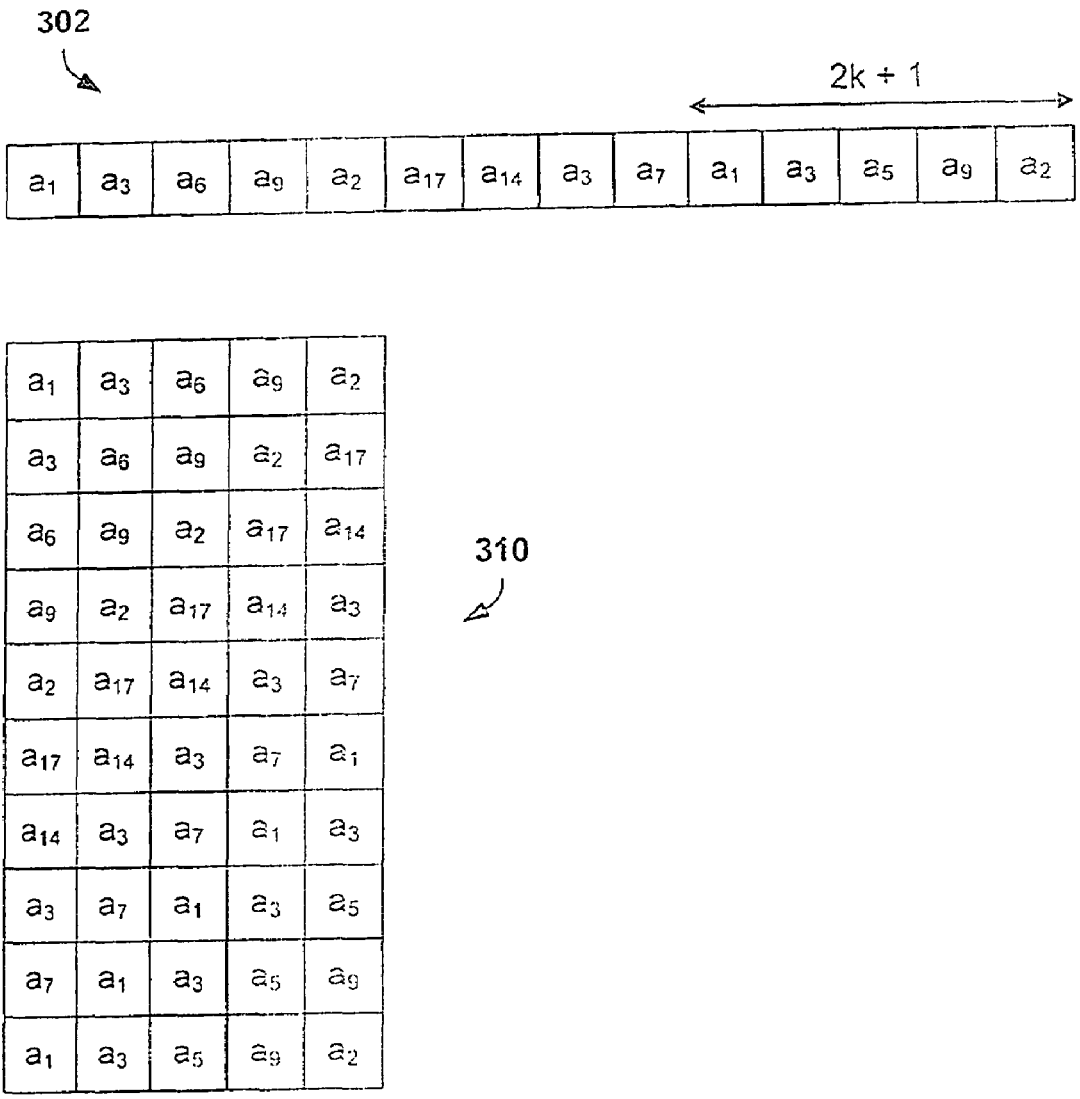

As shown in FIG. 3B, DUDE then slides the window of length 2k+1 rightward, by one symbol, to consider a second metasymbol 314 of length 2k+1. In this second metasymbol, the symbol "$a_9$" appears within the context ["$a_3a_6$," "$a_2a_{17}$"]. This second metasymbol is entered into table 310 as the second entry 316. FIG. 3C shows detection of a third metasymbol 318 in the noisy signal 302 and entry of the third metasymbol into table 310 as entry 320. FIG. 3D shows the table 310 following complete analysis of the short noisy signal 302 by DUDE. Although, in the examples shown in FIG. 3-D, DUDE lists each metasymbol as a separate entry in the table, in a more efficient implementation, DUDE enters each detected metasymbol only once in an index table, and increments an occurrence count each time the metasymbol is subsequently detected. In this fashion, in a first pass, DUDE tabulates the frequency of occurrence of metasymbols within the noisy signal or, viewed differently, DUDE tabulates the occurrence frequency of symbols within contexts comprising k preceding and k subsequent symbols surrounding each symbol.

Figure 4:
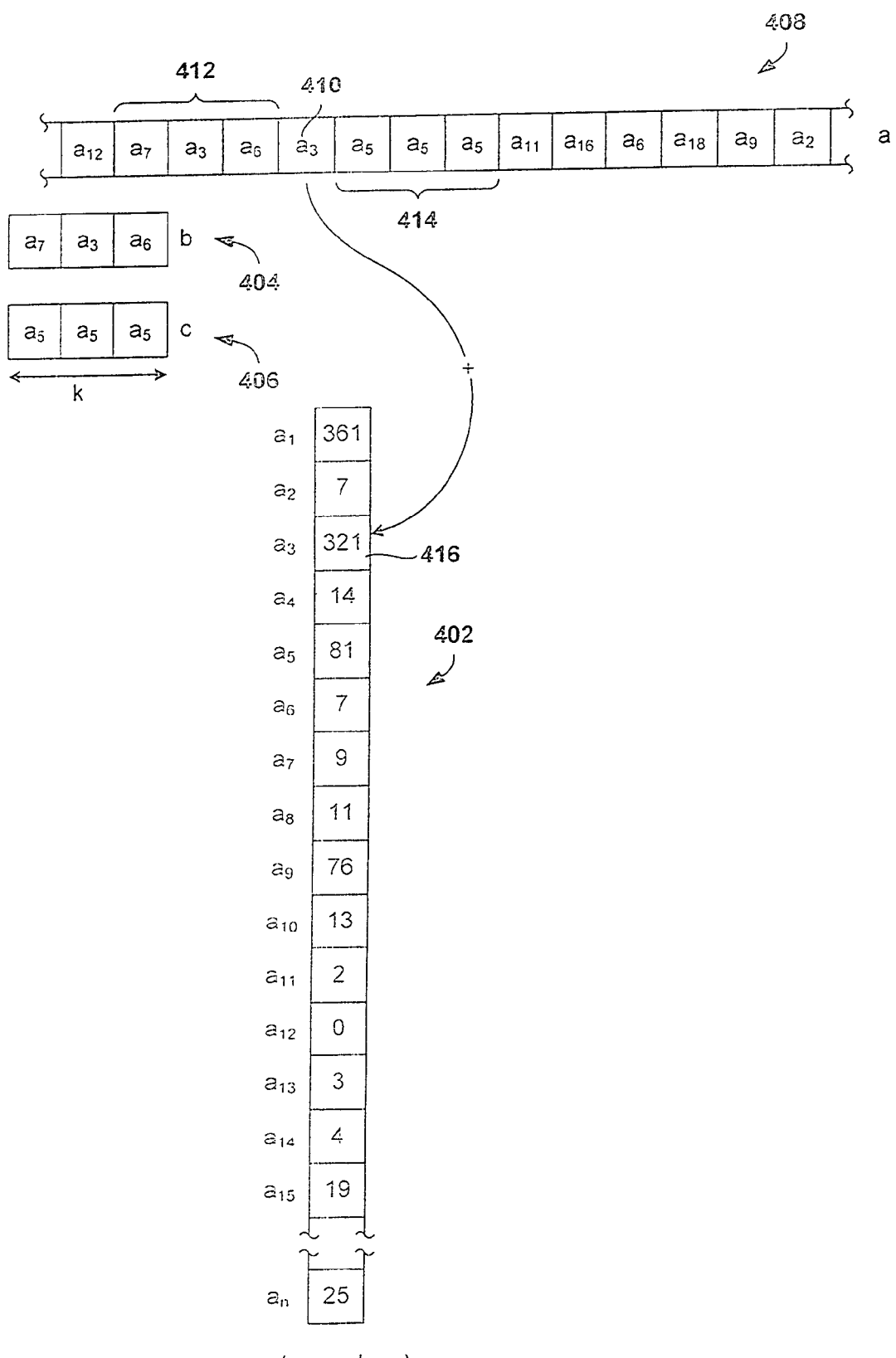
FIG. 4 illustrates a convenient mathematical notation and data structure representing a portion of the metasymbol table constructed by a discrete denoiser, as described with reference to FIGS. 3A-D.

FIG. 4 illustrates a convenient mathematical notation and data structure representing a portion of the metasymbol table constructed by DUDE, as described with reference to FIGS. 3A-D. The column vector m($s_{noisy}$,b,c) 402 represents a count of the occurrences of each symbol in the alphabet A within a particular context, represented by the k-length symbol vectors b and c, within the noisy signal $s_{noisy}$, where the noisy signal is viewed as a vector. In FIG. 4, for example, the context value for which the occurrence counts are tabulated in column vector m($s_{noisy}$,b,c) comprises the symbol vector 404 and the symbol vector 406, where k has the value 3. In the noisy signal $s_{noisy}$ 408, the symbol "$a_3$" 410 occurs within the context comprising three symbols 412 to the left of the symbol "$a_3$" 410 and three symbols 414 to the right of the symbol "$a_3$". This particular context has a value equal to the combined values of symbol vectors 404 and 406, denoted ["$a_7a_3a_6$," "$a_5a_5a_5$"] and this occurrence of the symbol "$a_3$" 410 within the context ["$a_7a_3a_6$," "$a_5a_5a_5$"], along with all other occurrences of the symbol "$a_3$" in the context ["$a_7a_3a_6$," "$a_5a_5a_5$"], is noted by a count 416 within the column vector m($s_{noisy}$,b,c), with [b,c]=["$a_7a_3a_6$," "$a_5a_5a_5$"]. In other words, a symbol "$a_3$" occurs within the context ["$a_7a_3a_6$," "$a_5a_5a_5$"] in the noisy signal $s_{noisy}$ 321 times. The counts for the occurrences of all other symbols "$a_1$", "$a_2$", and "$a_4$"-"$a_n$" in the context ["$a_7a_3a_6$," "$a_5a_5a_5$"] within noisy signal $s_{noisy}$ are recorded in successive elements of the column vector m($s_{noisy}$, "$a_7a_3a_6$", "$a_5a_5a_5$"). An individual count within a column vector m($s_{noisy}$,b,c) can be referred to using an array-like notation. For example, the count of the number of times that the symbol "$a_3$" appears in the context ["$a_7a_3a_6$," "$a_5a_5a_5$"] within the noisy signal $s_{noisy}$, 321, can be referred to as m($s_{noisy}$, "$a_7a_3a_6$", "$a_5a_5a_5$") [$a_3$].

DUDE employs either a full or a partial set of column vectors for all detected contexts of a fixed length $2k$ in the noisy signal in order to denoise the noisy signal. Note that an initial set of symbols at the beginning and end of the noisy signal of length k are not counted in any column vector m($s_{noisy}$, b,c) because they lack either sufficient preceding or subsequent symbols to form a metasymbol of length $2k+1$. However, as the length of the noisy signal for practical problems tends to be quite large, and the context length k tends to be relatively small, DUDE's failure to consider the first and final k symbols with respect to their occurrence within contexts makes almost no practical different in the outcome of the denoising operation.

Figures 5A, 5B:
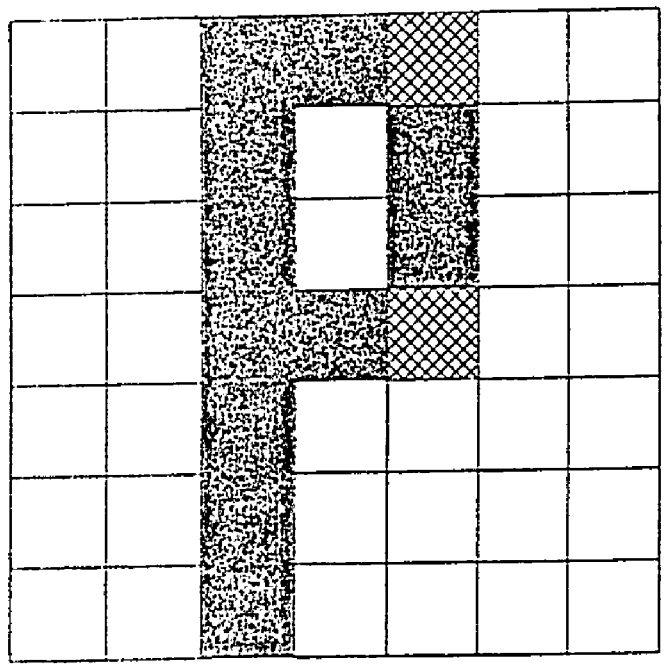
FIGS. 5A-D illustrate the concept of symbol-corruption-related distortion in a noisy or recovered signal.

FIGS. 5A-D illustrate the concept of symbol-corruption-related distortion in a noisy or recovered signal. The example of FIGS. 5A-D relates to a 256-value gray scale image of a letter. In FIG. 5A, the gray-scale values for cells, or pixels, within a two-dimensional image 502 are shown, with the character portions of the symbol generally having a maximum gray-scale value of 255 and the background pixels having a minimum gray-scale value of zero, using a convention that the displayed darkness of the pixel increases with increasing numerical value. Visual display of the image represented by the two-dimensional gray-scale signal in FIG. 5A is shown in FIG. 5B 504. The gray-scale data in FIG. 5A is meant to represent a low resolution image of the letter "P." As shown in FIG. 5B, the image of the letter "P" is reasonably distinct, with reasonably high contrast.

Figures 5C, 5D:
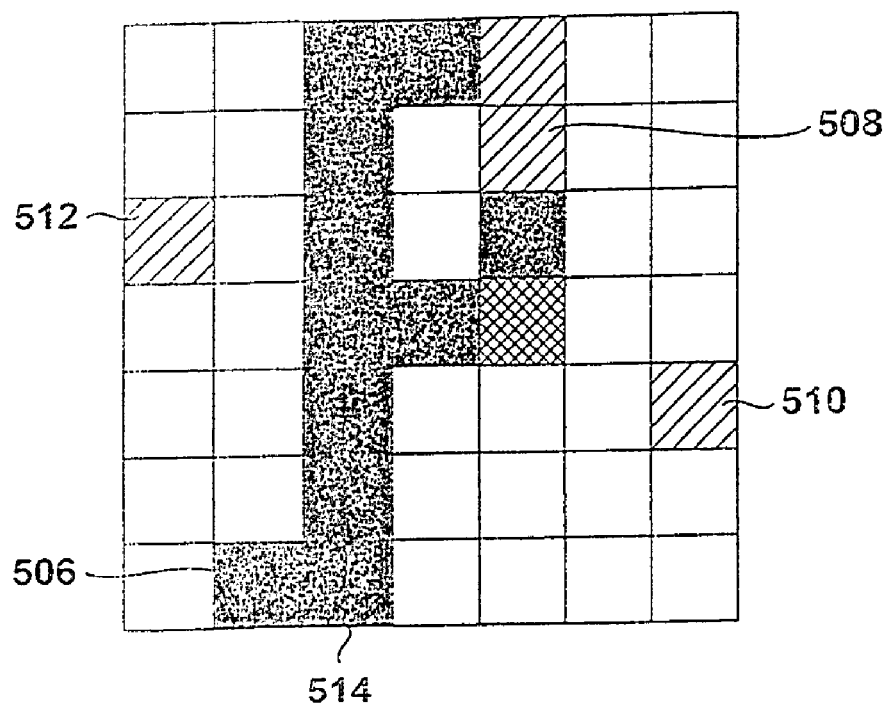

FIG. 5C shows the gray-scale data with noise introduced by transmission through a hypothetical noise-introducing channel. Comparison of FIG. 5C to FIG. 5A shows that there is marked difference between the gray-scale values of certain cells, such as cell 506, prior to, and after, transmission. FIG. 5D shows a display of the gray-scale data shown in FIG. 5C. The displayed image is no longer recognizable as the letter "P." In particular, two cells contribute greatly to the distortion of the figure: (1) cell 506, changed in transmission from the gray-scale value "0" to the gray-scale value "223"; and (2) cell 508, changed in transmission from the gray-scale value "255" to the gray-scale value "10." Other noise, such as the relatively small magnitude gray-scale changes of cells 510 and 512, introduce relatively little distortion, and, by themselves, would have not seriously impacted recognition of the letter "P." In this case, the distortion of the displayed image contributed by noise introduced into the gray-scale data appears to be proportional to the magnitude of change in the gray-scale value. Thus, the distorting effects of noise within symbols of a signal are not necessarily uniform. A noise-induced change of a transmitted symbol to a closely related, received symbol may produce far less distortion than a noise-induced change of a transmitted symbol to a very different, received symbol.

The DUDE models the non-uniform distortion effects of particular symbol transitions induced by noise with a matrix $\Lambda$. FIG. 6 displays one form of the symbol-transformation distortion matrix $\Lambda$. An element $d_{a_i \to a_j}$ of the matrix $\Lambda$ provides the relative distortion incurred by substituting the symbol "$a_j$" in the noisy or recovered signal for the symbol "$a_i$" in the clean signal. An individual column j of the matrix $\Lambda$ may be referred to as $\lambda_j$ or $\lambda_{a_j}$.

FIG. 7 illustrates computation of the relative distortion, with respect to the clean signal, expected from replacing a symbol "$a_\alpha$" in a received, noisy signal by the symbol "$a_x$." As shown in FIG. 7, element-by-element multiplication of the elements of the column vectors $\lambda_{a_x}$ and $\pi_{a_\alpha}$, an operation known as the Shur product of two vectors, and designated in the current discussion by the symbol $\square$, produces the column vector $\lambda_{a_x} \square \pi_{a_\alpha}$ in which the i-th element is the product of a distortion and probability, $d_{a_i \to a_x} p_{a_i \to a_\alpha}$, reflective of the relative distortion expected in the recovered signal by replacing the symbol $a_\alpha$ in the noisy symbol by the symbol "$a_x$" when the symbol in the originally transmitted, clean signal is "$a_i$."

FIG. 8 illustrates use of the column vector $\lambda_{a_x} \square \pi_{a_\alpha}$ to compute a distortion expected for replacing "$a_\alpha$" in the metasymbol b$a_\alpha$c in a noisy signal $s_{noisy}$ by the replacement symbol "$a_x$". In the following expression, and in subsequent expressions, the vectors $s_{noisy}$ and $s_{clean}$ denote noisy and clean signals, respectively. A different column vector q can be defined to represent the occurrence counts for all symbols in the clean signal that appear at locations in the clean signal that correspond to locations in the noisy signal around which a particular context [b, c] occurs. An element of the column vector q is defined as:

$$q(s_{noisy}, s_{clean}, b, c)[a_\alpha] = |\{i : s_{clean}[i] = a_\alpha, (s_{noisy}[i-k], s_{noisy}[i-k+1], \ldots, s_{noisy}[i-1]) = b, (s_{noisy}[i+1], s_{noisy}[i+2], \ldots, s_{noisy}[i+k]) = c\}|,$$

where
   $s_{clean}[i]$ and $s_{noisy}[i]$ denote the symbols at location i in the clean and noisy signals, respectively; and
   $a_\alpha$ is a symbol in the alphabet A.

The column vector $q(s_{noisy}, s_{clean}, b, c)$ includes n elements with indices $a_\alpha$ from "$a_1$" to "$a_n$," where n is the size of the symbol alphabet A. Note that the column vector $q(s_{noisy}, s_{clean}, b, c)$ is, in general, not obtainable, because the clean signal, upon which the definition depends, is unavailable. Multiplication of the transpose of the column vector $q(s_{noisy}, s_{clean}, b, c)$, $q^T(s_{noisy}, s_{clean}, b, c)$, by the column vector $\lambda_{a_x} \square \pi_{a_\alpha}$ produces the sum of the expected distortions in the column vector times the occurrence counts in the row vector that together provide a total expected distortion for replacing "$a_\alpha$" in the metasymbol b$a_\alpha$c in $s_{noisy}$ by "$a_x$". For example, the first term in the sum is produced by multiplication of the first elements in the row vector by the first element in the column vector, resulting in the first term in the sum being equal to $q^T(s_{noisy}, s_{clean}, b, c)[a_1](p_{a_1 \to a_\alpha} d_{a_1 \to a_x})$ or, in other words, a contribution to the total distortion expected for replacing "$a_\alpha$" by "$a_x$" in all occurrences of b$a_\alpha$c in $s_{noisy}$ when the corresponding symbol in $s_{clean}$ is $a_1$. The full sum gives the full expected distortion:

$$q^T(s_{noisy}, s_{clean}, b, c)[a_1](p_{a_1 \to a_\alpha} d_{a_1 \to a_x}) +$$
$$q^T(s_{noisy}, s_{clean}, b, c)[a_2](p_{a_2 \to a_\alpha} d_{a_2 \to a_x}) +$$
$$q^T(s_{noisy}, s_{clean}, b, c)[a_3](p_{a_3 \to a_\alpha} d_{a_3 \to a_x}) +$$
$$\vdots$$
$$q^T(s_{noisy}, s_{clean}, b, c)[a_n](p_{a_n \to a_\alpha} d_{a_n \to a_x})$$

As discussed above, DUDE does not have the advantage of knowing the particular clean signal, transmitted through the noise-introducing channel that produced the received noisy signal. Therefore, DUDE estimates the occurrence counts, $q^T(s_{noisy}, s_{clean}, b, c)$, of symbols in the originally transmitted, clean signal, by multiplying the row vector $m^T(s_{noisy}, b, c)$ by $\Pi^{-1}$ from the right. FIG. 9 shows estimation of the counts of the occurrences of symbols "$a_1$"-"$a_n$" for the clean signal.

The resulting expression $$m^T(s_{noisy}, b, c)\Pi^{-1}(\lambda_{a_x} \odot \pi_{a_\alpha})$$

obtained by substituting $m^T(s_{noisy}, b, c)\Pi^{-1}$ for $q^T(s_{noisy}, s_{clean}, b, c)$ represents DUDE's estimation of the distortion, with respect to the originally transmitted clean signal, produced by substituting "$a_x$" for the symbol "$a_\alpha$" within the context [b, c] in the noisy signal $s_{noisy}$. DUDE denoises the noisy signal by replacing "$a_\alpha$" in each occurrence of the metasymbol $ba_\alpha c$ by that symbol "$a_x$" providing the least estimated distortion of the recovered signal with respect to the originally transmitted, clean signal, using the above expression. In other words, for each metasymbol $ba_\alpha c$, DUDE employs the following transfer function to determine how to replace the central symbol $a_\alpha$:

$$g_\alpha^k(b, a_\alpha, c) = \frac{\text{argmin}}{a_x = a_1 \text{to } a_n} [m^T(s_{noisy}, b, c) \Pi^{-1}(\lambda_{a_x} \odot \pi_{a_\alpha})]$$

In some cases, the minimum distortion is produced by no substitution or, in other words, by the substitution $a_x$ equal to $a_\alpha$.

FIG. 10 illustrates the process by which DUDE denoises a noisy, received signal. First, as discussed above, DUDE compiles counts for all or a portion of the possible metasymbols comprising each possible symbol "$a_i$" within each possible context [b, c]. As discussed above, the counts are stored in column vectors $m(s_{noisy}, b, c)$. In the next pass, DUDE again passes a sliding window over the noisy signal 1002. For each metasymbol, such as metasymbol 1004, DUDE determines the relative distortions of the recovered signal with respect to the clean signal that would be produced by substituting for the central character of the metasymbol "$a_\alpha$" each possible replacement symbol "$a_i$" in the range i=1 to n. These relative distortions are shown in table 1006 in FIG. 10 for the metasymbol 1004 detected in the noisy signal 1002. Examining the relative distortion table 1006, DUDE selects the replacement symbol with the lowest relative distortion, or, in the case that two or more symbols produce the same relative distortions, selects the first of the multiple replacement symbols with the lowest estimated distortion. In the example shown in FIG. 10, that symbol is "$a_3$" 1008. DUDE then replaces the central symbol "$a_\alpha$" 1010 in the noisy signal with the selected replacement symbol "$a_3$" 1012 in the recovered signal 1014. Note that the recovered signal is generated from independent considerations of each type of metasymbol in the noisy signal, so that the replacement symbol selected in a previous step does not affect the choice for a replacement symbol in a next step for a different metasymbol. In other words, the replacement signal is generated in parallel, rather than substitution of symbols directly into the noisy signal. As with any general method, the above-described method by which DUDE denoises a noisy signal can be implemented using various data structures, indexing techniques, and algorithms to produce a denoising method that has both linear time and linear working-data-set complexities or, in other words, the time complexity is related to the length of the received, noisy signal, by multiplication by a constant, as is the working-data-set complexity.

The examples employed in the above discussion of DUDE are primarily 1-dimensional signals. However, as also discussed above, 2-dimensional and multi-dimensional signals may also be denoised by DUDE. In the 2-and-multi-dimensional cases, rather than considering symbols within a 1-dimensional context, symbols may be considered within a contextual neighborhood. The pixels adjacent to a currently considered pixel in a 2-dimensional image may together comprise the contextual neighborhood for the currently considered symbol, or, equivalently, the values of a currently considered pixel and adjacent pixels may together comprise a 2-dimensional metasymbol. In a more general treatment, the expression $m^T(s_{noisy}, b, c)\Pi^{-1}(\lambda_{a_x} \odot \pi_{a_\alpha})$ may be replaced by the more general expression:

$$m^T(s_{noisy}, \eta)\Pi^{-1}(\lambda_{a_x} \odot \pi_{a_\alpha})$$

where $\eta$ denotes the values of a particular contextual neighborhood of symbols. The neighborhood may be arbitrarily defined according to various criteria, including proximity in time, proximity in display or representation, or according to any arbitrary, computable metric, and may have various different types of symmetry. For example, in the above-discussed 1-dimensional-signal examples, symmetric contexts comprising an equal number of symbols k preceding and following a currently considered symbol compose the neighborhood for the currently considered symbol, but, in other cases, a different number of preceding and following symbols may be used for the context, or symbols either only preceding or following a current considered symbol may be used.

Methods and Systems for Producing Variable-Length Contexts for Various Context-Model-Based Applications The discrete digital data denoising method outlined in the preceding subsection is one example of the use of context models in computational applications, and an example that will be used in this subsection as an illustrative computational platform in which variable-length contexts may be employed. In the above-discussed denoising method, symbols in a noisy signal are considered with respect to k-length symbol vectors b and c preceding and following, respectively, each symbol. The occurrence counts of up to $n^{2k+1}$ different metasymbols $ba_\alpha c$, where $a_\alpha$ is an element of $\{a_1, a_2, \ldots, a_n\}$, are stored in an occurrence-count table. The method examines each symbol $a_\alpha$ in a noisy signal within the b and c context surrounding the symbol in order to decide whether or not to replace the symbol $a_\alpha$ with a different symbol $a_\beta$.

Figure 11:
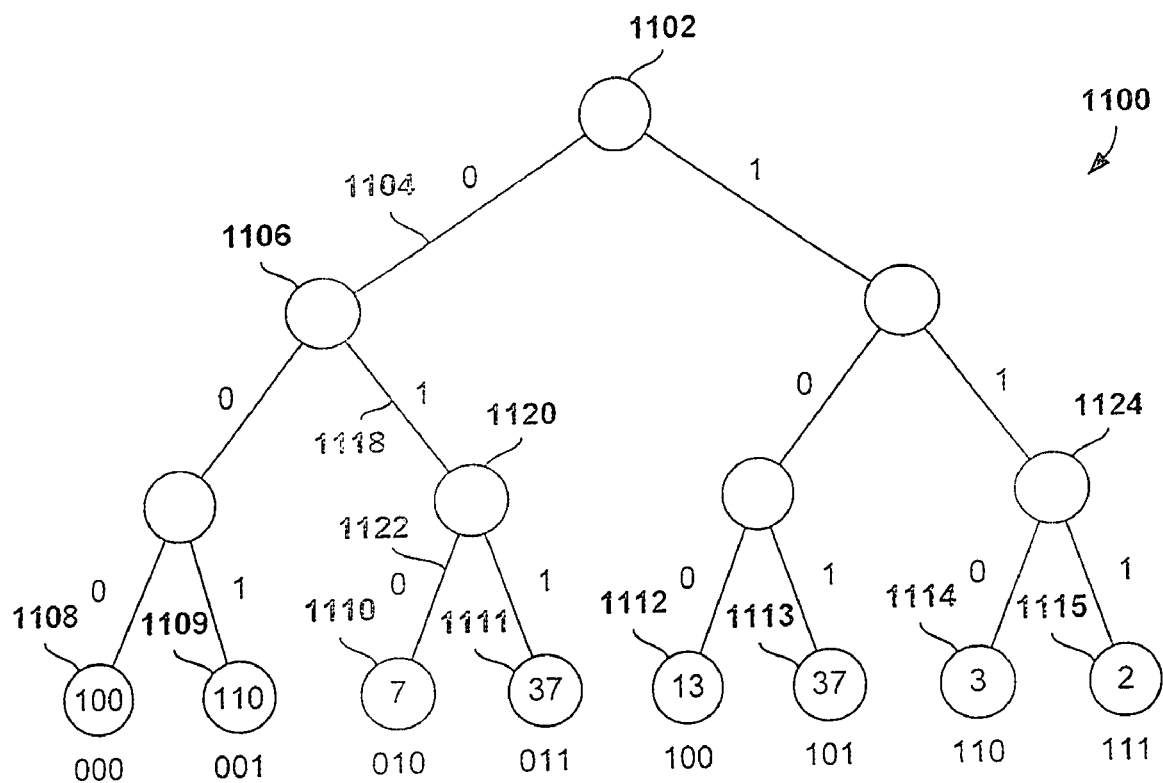
FIG. 11 shows a balanced tree representing all possible contexts of length 3 in the binary alphabet.

FIG. 11 shows a balanced tree representing all possible contexts of length 3 in the binary alphabet. The tree 1100 in FIG. 11 is an acyclic graph comprising nodes, such as the root node 1102, and edges, such as the edge 1104 connecting the root node 1102 with a second level node 1106. Each node has two edges leading to two children, one edge associated with the binary alphabet symbol "0" and the other edge associated with the binary alphabet symbol "1." Representation of all possible fixed-length contexts with symbols from an alphabet containing n symbols would have nodes with n edges leading to n children. The resulting balanced tree has $n^K$ leaf nodes, where K is the number of symbols comprising the context. Thus, in the balanced tree 1100 shown in FIG. 11, there are $2^3$, or 8, leaf nodes 1108-15. Each leaf node is associated with a different possible context. The context associated with a leaf node can be derived as the sequence of binary symbols along the edges of a path leading from the root node to the leaf node. In the example of FIG. 11, a root-to-leaf traversal of the balanced tree constructs a one-dimensional symbol context in left-to-right order. For any particular type of context of a any particular dimension, an ordered correspondence between the labels of the edges of the tree and symbols within the context is defined. In FIG. 11, leaf node 1110 is associated with a context "010," derived by following the path consisting of the root node, edge 1104, node 1106, edge 1118, node 1120, and edge 1122.

When the frequency of occurrence of the different possible contexts is relatively uniform, consideration of a fixed-length context is appropriate, with K chosen, as discussed in the previous subsection, to be sufficiently small so that the different possible contexts are associated with occurrence counts sufficiently large to give statistical meaning to results derived from the context model, but with K chosen to be sufficiently large to provide a reasonable number of metasymbols to cover metasymbol-occurrence patterns within signals. However, when the possible contexts are not uniformly distributed, it may make sense to use variable-length contexts ranging up to a full context length, or size K, so that, for example, extremely rare metasymbols may be grouped together and represented as a shorter metasymbol. By contrast, full context lengths may be employed in order to differentiate similar, frequently occurring metasymbols. By employing statistically relevant variable length contexts in an analysis, better models of the noisy data can be obtained by achieving a reasonable tradeoff between the extents of modeled dependencies and the statistical accuracy of estimated model parameters.

In FIG. 11, the occurrence counts for the contexts within a hypothetical signal are included within the circles representing each leaf node. Inspection of the occurrence counts reveals that the contexts "000" and "001" occur far more frequently than the other possible contexts of length 3. Therefore, an efficient variably sized context model might employ the full contexts "000" and "001," while lumping the contexts "110" and "111" together in the shorter context "11" in order to avoid considering a 3-symbol context for two extremely rarely occurring contexts.

In order to create a variably sized context model, the balanced tree shown in FIG. 11 may be sequentially pruned. In pruning the balanced tree, a merge metric is computed for each node, and the node with the lowest or highest metric, depending on the sense of the metric, is selected for merging. A node merge involves promoting the occurrence counts of the children of that node to the merged node, and removing the children nodes from consideration. The merge operation therefore replaces the contexts associated with the children nodes by a shorter context associated with the merged node. Following each merge operation, the tree is again searched for a node with the lowest, or highest merge metric, depending on the sense of the metric, and the subsequently identified node is merged. The process may continue until the number of leaves of the pruned tree is less than or equal to some desirable number. In this pruning method, a node may be merged only if all of its children are leaf nodes.

In one embodiment of the pruning method, the merge metric for a node is computed as the smallest occurrence count of any children nodes of the node. In this embodiment, the node with the smallest merge metric is next chosen for merging. In FIG. 11, for example, the third level node 1124 having children associated with occurrence counts of three and two, 1114 and 1115, has the lowest merge metric, and would be the first candidate node for a merge operation.

Figure 12A:
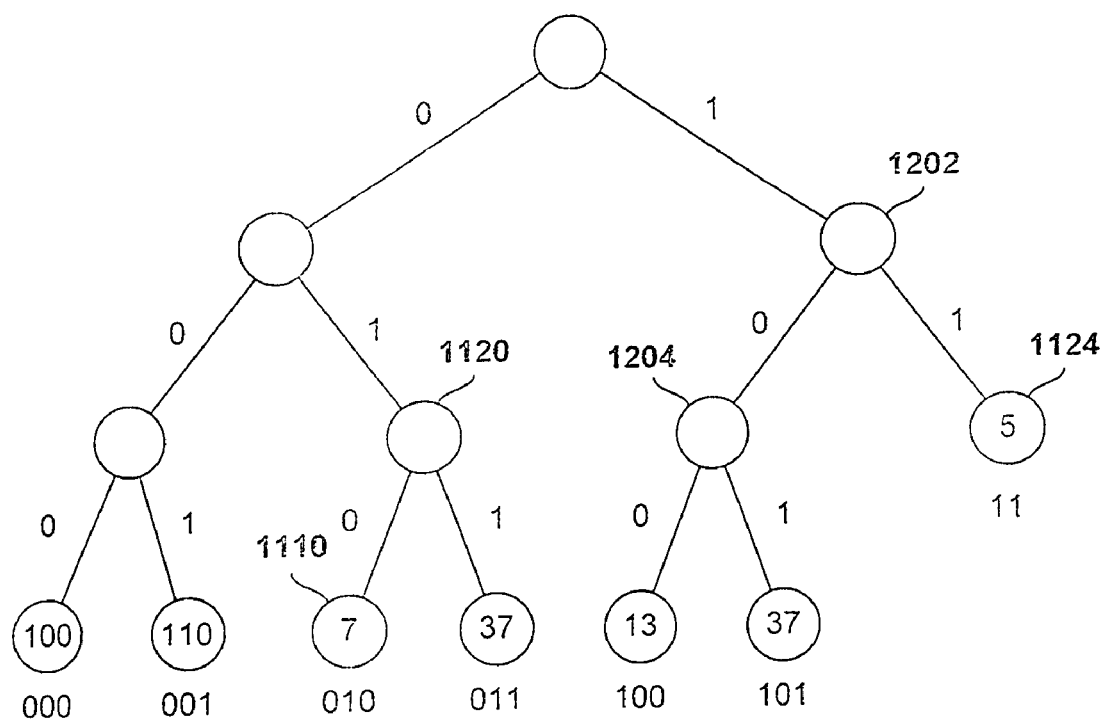
FIGS. 12A-D illustrate pruning of the balanced context tree shown in FIG. 11.
Figure 12B:
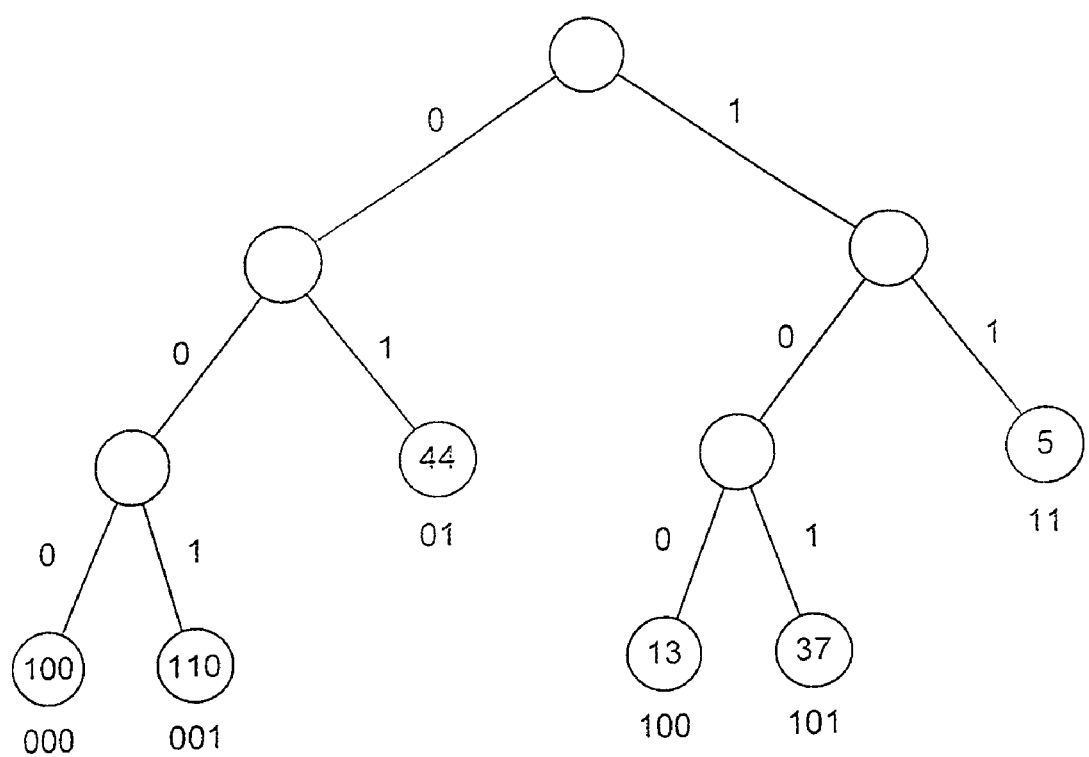
Figure 12C:
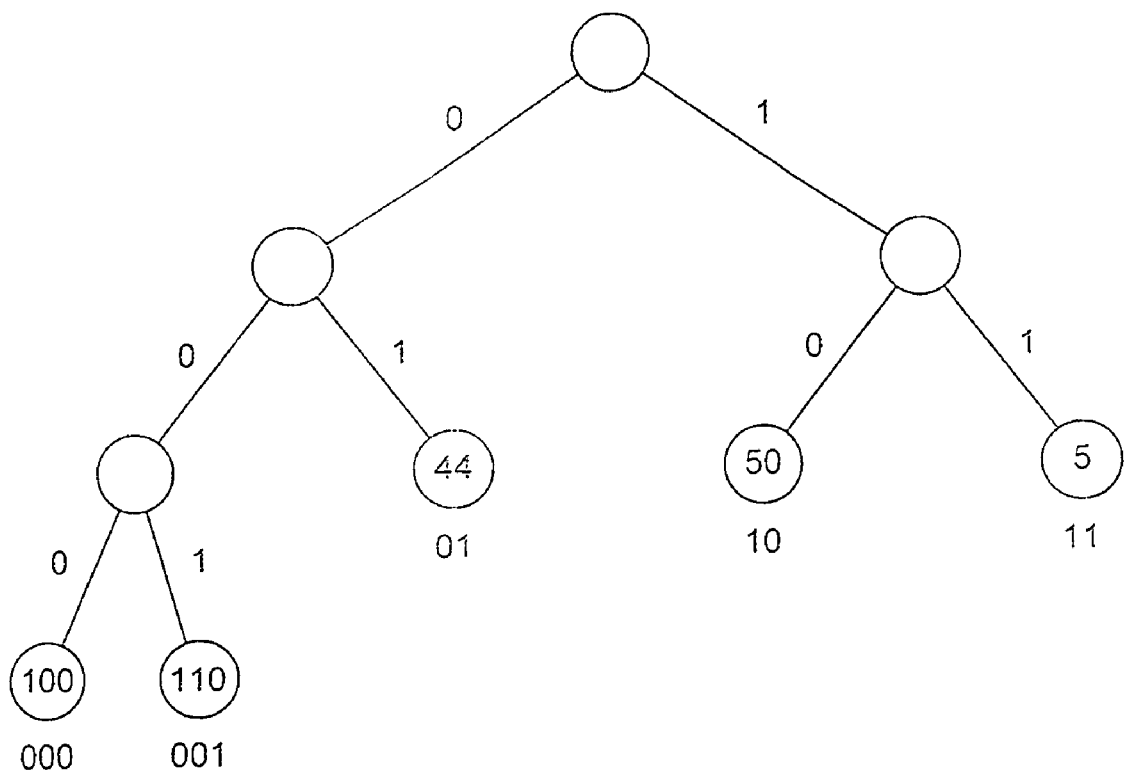
Figure 12D:
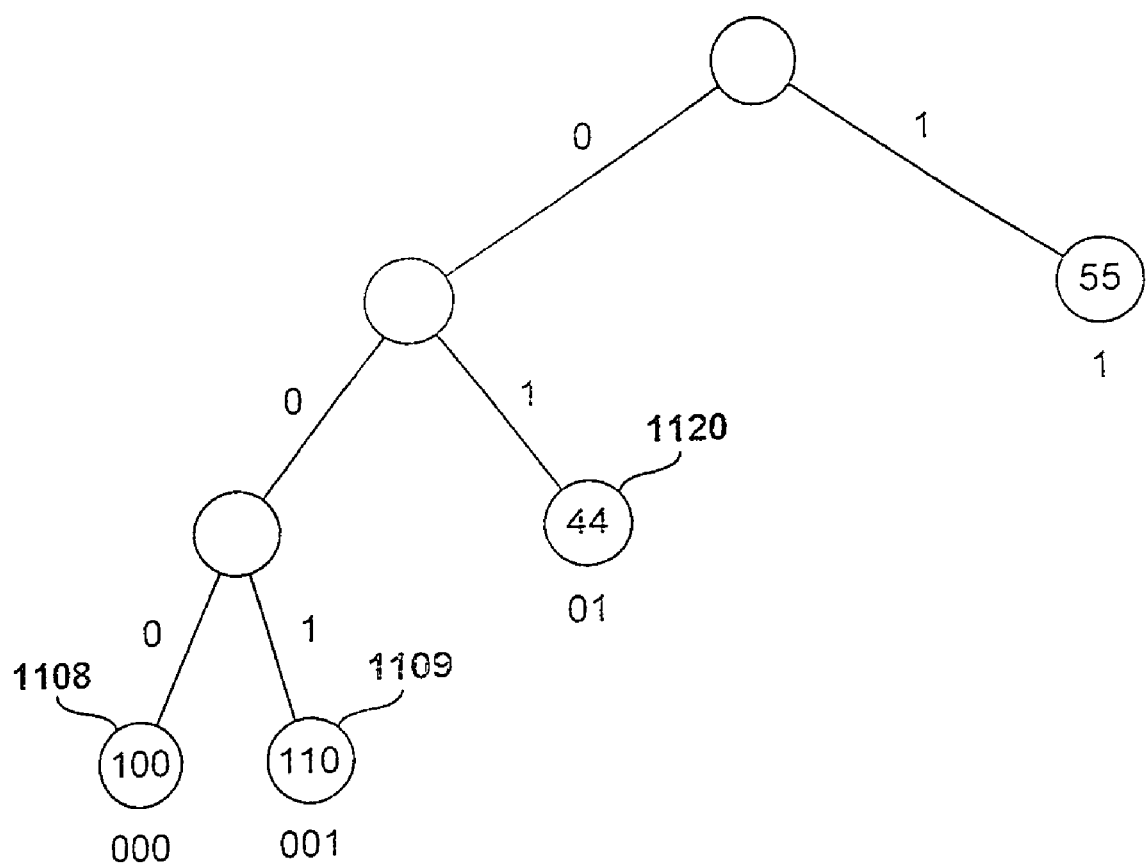

FIGS. 12A-D illustrate pruning of the balanced context tree shown in FIG. 11. As mentioned above, node 1124 in FIG. 11 has the smallest merge metric, and is therefore first merged to prune children nodes 1114 and 1115. FIG. 12A shows the context tree of FIG. 11 after a first pruning operation. The context tree of FIG. 12A is no longer balanced, and therefore represents a variably sized context model. In particular, the variably sized context model has six 3-symbol contexts and a single, 2-symbol context represented by the merged node 1124. Note that the sum of the occurrence counts of the children of the merged node 1124, 5, is promoted to the merge node. The unbalanced context tree of FIG. 12A is then again inspected to identify the next node, ready for merging, with the smallest merge metric. That node is the third level node 1120, since its left-hand child 1110 has the lowest occurrence count. Note that the absolute lowest occurrence count resides in previously merged node 1124, but node 1202, the parent of node 1124, is not ready for merging, since its other child, node 1204, is not a leaf node. Following merging of node 1120, the context tree of FIG. 12B is obtained. The context tree of FIG. 12B represents a variably sized context model that includes four 3-symbol contexts and two 2-symbol contexts. The pruning operation is carried out a third time to produce the context tree shown in FIG. 12C. The context tree in FIG. 12C represents a context model having two 3-symbol contexts and three 2-symbol contexts. A fourth pruning operation produces the context tree shown in FIG. 12D. The context tree shown in FIG. 12D represents a variably sized context model having two 3-symbol contexts, one 2-symbol context, and one 1-symbol context.

Using the variably sized context model represented by the context tree shown in FIG. 12D, a computational application employing the variably sized context model needs only to consider a single symbol adjoining a symbol considered for replacement when the adjoining symbol is the binary symbol "1." In other words, all 3-symbol contexts beginning with the binary symbol "1" have been merged together into a 1-symbol context "1."

Figure 13:
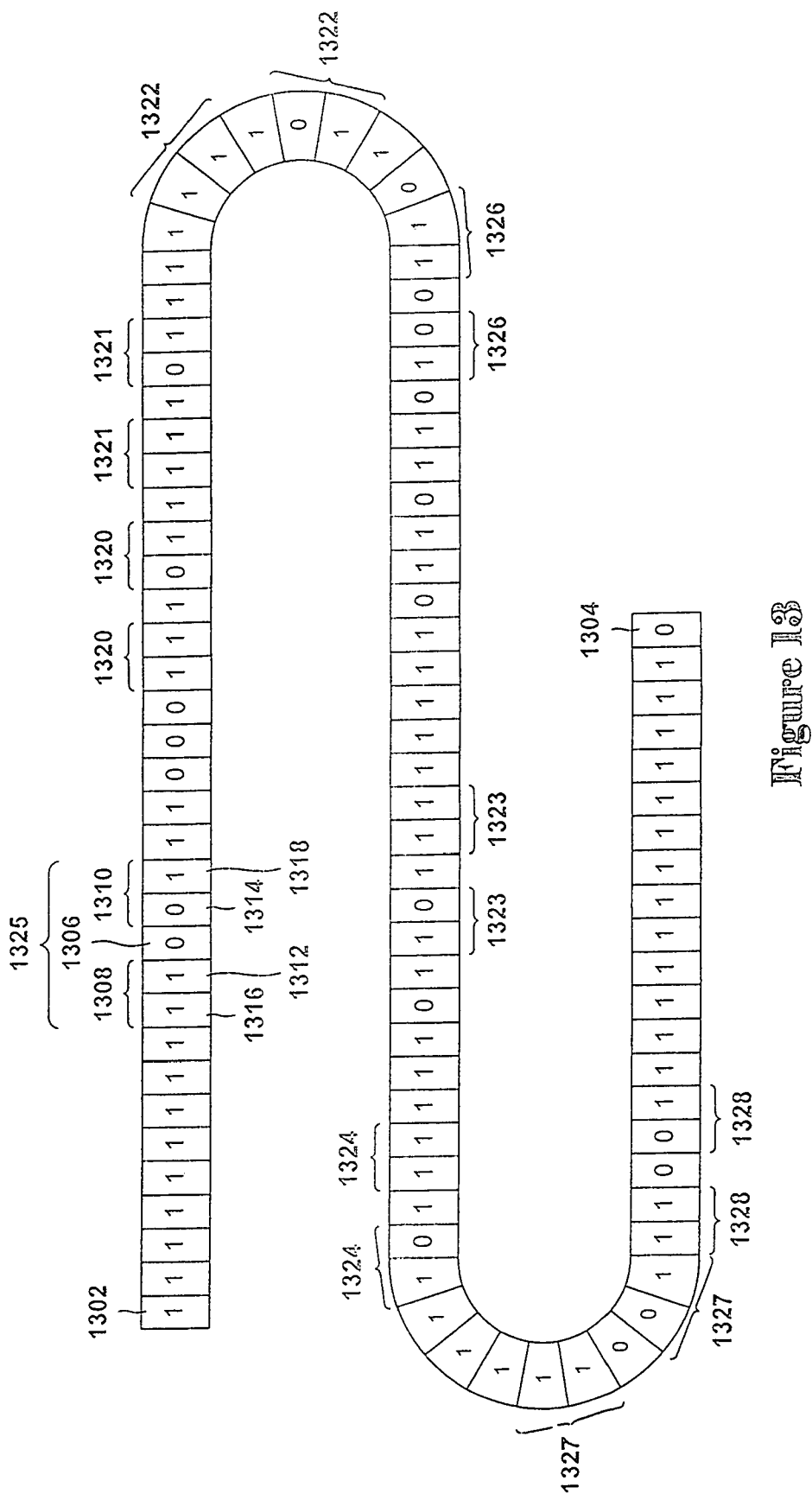
FIG. 13 shows an example 99-symbol binary signal.

The variable-length-context-model generation method, carried out by pruning a complete context tree as discussed above with reference to FIGS. 11 and 12A-D, can be employed, with minor adjustment, to generate variably sized context models for the double-sided contexts used in the DUDE, described above, as well as for even more complex contexts, such as two-dimensional contexts representing neighborhoods of pixels in digital images. In other words, the method is general, and can be applied to any of a nearly limitless number of different types of contexts for signals of arbitrary length composed of symbols chosen from alphabets of arbitrary sizes. In the following example, variably sized context models are generated for a 99-symbol signal with symbols chosen from the binary alphabet {0,1}. FIG. 13 shows an example, 99-symbol binary signal. The signal starts with the symbol "1" 1302 and ends with the symbol "0" 1304. In this example, each symbol is considered within a context comprising a left context b that includes the two symbols immediately preceding the considered, or central symbol, and a right context c that includes two symbols immediately following the considered, or central, symbol.

Figure 14A:
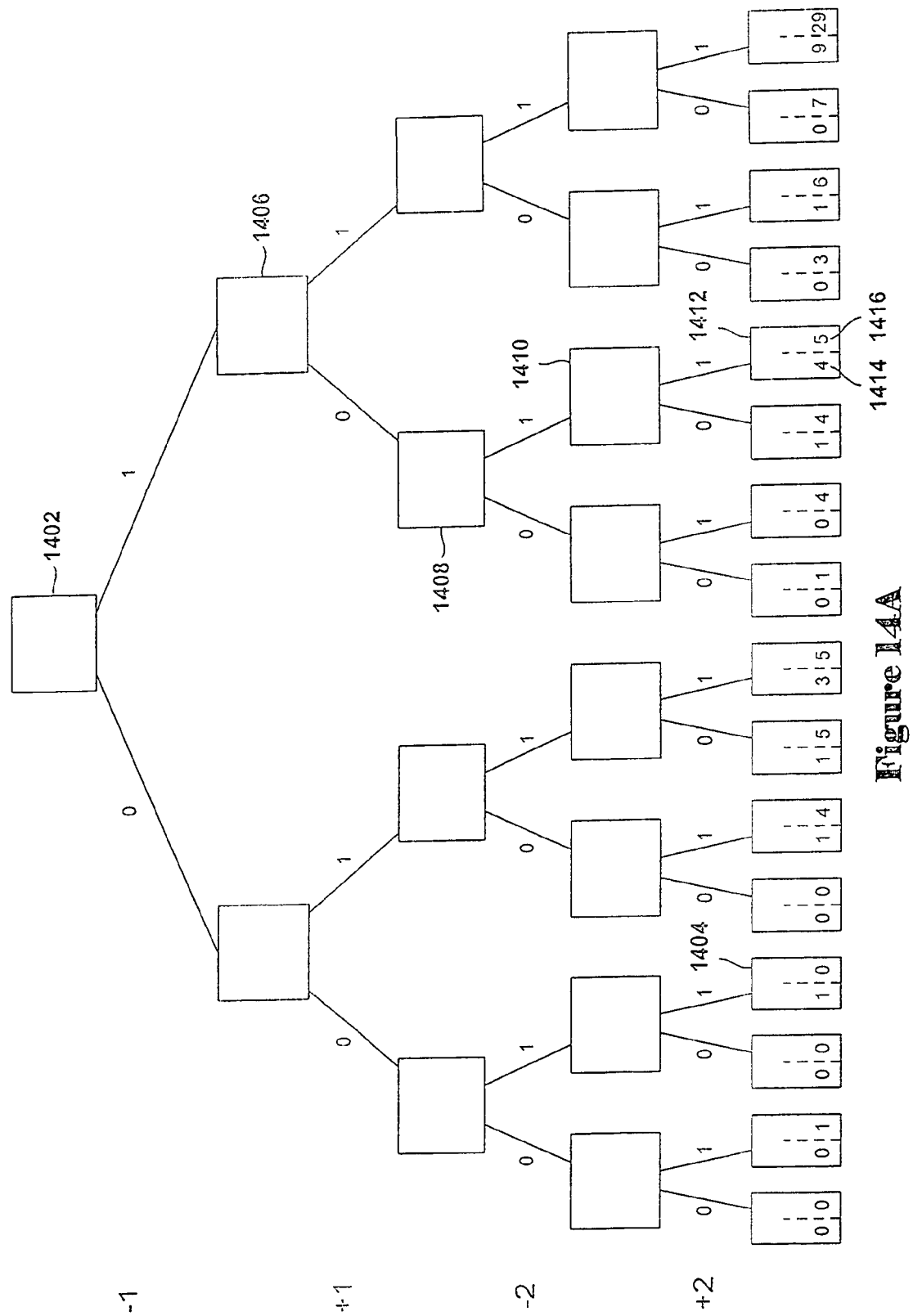
FIGS. 14A-B illustrate construction of a full, balanced context tree for the example data signal shown in FIG. 13, and sequential pruning of the balanced context tree to generate variably sized context models.
Figure 14B:
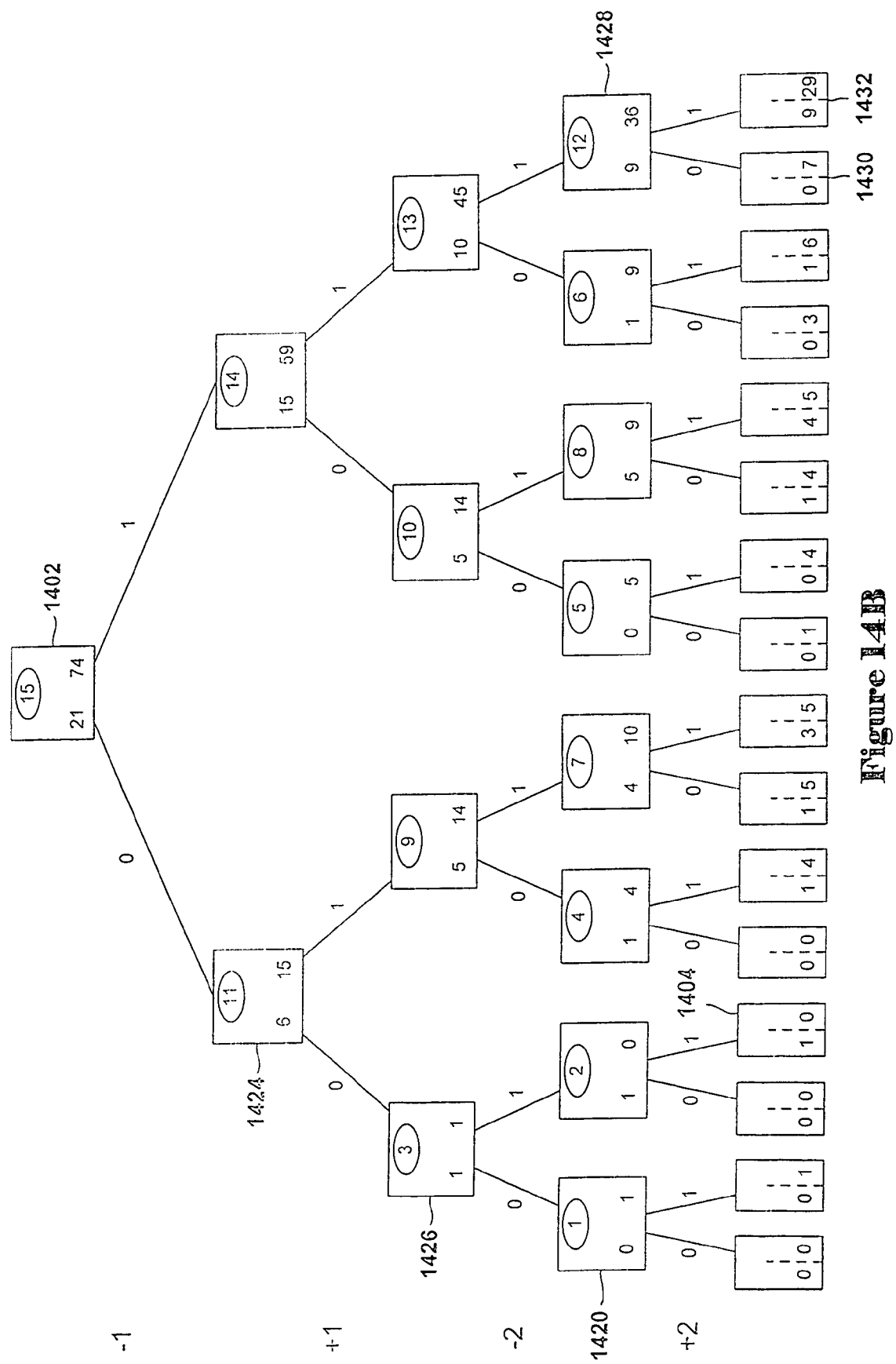

FIGS. 14A-B illustrate construction of a full, balanced context tree for the example data signal shown in FIG. 13, and sequential pruning of the balanced context tree to generate variably sized context models. FIG. 14A shows an initial state of a full, balanced context tree. The symbol labels on the four edges of the balanced tree connecting the root node 1402 to a particular leaf node, such as leaf node 1404, fully specify both the two-symbol left context and the two-symbol right context of a four-symbol context represented by the leaf node. The mapping of the left and right contexts to a single tree is, to some extent, arbitrary. In the current example, the first edge connecting the root node 1402 with a second-level node specifies the symbol immediately preceding a considered, or central, symbol. The next edge, connecting the second-level node with a third-level node, specifies the symbol immediately following the considered symbol, the next edge, connecting the third-level node with a fourth-level node, specifies the symbol preceding the considered symbol by two symbols, and the final edge, connecting the fourth-level node with the leaf node, specifies the symbol following the considered symbol by two symbols. For example, consider the symbol 1306 in FIG. 13 within the context comprising the two-symbol left context 1308 and the two-symbol right context 1310. The leaf node in the balanced tree shown in FIG. 14A corresponding to this context can be identified as follows. The first symbol "1" 1312 preceding the considered symbol 1306 specifies traversal from the root node 1402 of the balanced tree to the second-level node 1406 along the edge labeled with the symbol "1." The symbol "0" 1314 immediately following the considered symbol 1306 specifies continued traversal from second-level node 1406 to third-level node 1408 along the edge labeled with the symbol "0." The symbol "1" 1316 preceding the considered symbol 1306 by two symbols specifies continued traversal from node 1408 to node 1410. Finally, the symbol "1" 1318 following the considered symbol 1306 by two symbols specifies a final traversal from node 1410 to leaf node 1412. Thus, leaf node 1412 represents the context {b=(1,1), c=(0,1)}. This same context occurs nine times in the example signal shown in FIG. 13. The context occurs five times with the central symbol within the context having the value "1" 1320-1324, and occurs four times with the central symbol having the value "0" 1325-1328. Therefore, leaf node 1412 in the context tree shown in FIG. 14A includes the symbol count "4" 1414 to indicate that the context appears four times in the signal with central symbol having the value "0," and includes the symbol count "5" 1416 to indicate that the context appears five times in the signal with the central symbol having the value "1." Each leaf node in the balanced context tree shown in FIG. 14A represents a different four-symbol context, and the 16 leaf nodes together represent all possible four-symbol contexts.

FIG. 14B shows a full sequential pruning of the balanced context tree shown in 14A to generate 15 different variably sized context models in addition to the full context model represented by the initial context tree shown in FIG. 14A. To create the sequentially pruned context tree shown in FIG. 14B, the sum of the symbol counts in all children nodes of a node is used as the merge metric. The smaller the merge metric, the more desirable the corresponding node for merging. The tree is repeatedly searched in a depth-first, left-to-right fashion, with the first node encountered having the smallest merge metric of remaining, unmerged nodes chosen for merging in the next iteration. Once two children of a node are merged, the central-symbol counts of the two child nodes are propagated to the parent. For example, parent node 1428 in FIG. 14B includes a 0-central-symbol count of 9 that is the sum of 0-central-symbol counts of 0 and 9 from child nodes 1430 and 1432, and includes a 1-central-symbol count of 36 that is the sum of 1-central-symbol counts of 7 and 29 from child nodes 1430 and 1432. In FIG. 14B, each non-leaf node includes a third, circled numerical value indicating the prune iteration in which the node is merged. For example, node 1420 contains the merge number "1," indicating that this is the first node merged during sequential pruning of the context tree. This node is chosen for merging first, because it is the first node encountered in the tree search with the smallest merge metric "1." Its sibling node 1422 also has the smallest merge metric "1." The merge number "2" included in node 1422 indicates that it is the second node merged during sequential pruning.

When a node is merged, the context tree frequently becomes unbalanced. In an unbalanced tree, not all nodes at each level within the tree have an equal number of children.

Another way of looking at an unbalanced tree is that, if children are removed from merged nodes, and all remaining nodes have an equal weight, were the tree to be suspended by its root node, the tree would rotate about the root node, because one side, having more nodes, would be heavier than the other side. An unbalanced context tree represents variably sized contexts. For example, in FIG. 14B, when the first merge operation merges node 1420, the left side of the context tree has fewer nodes than the right side of the context tree. Prior to the merge, the context tree describes all possible 4-symbol contexts, including the contexts "00x00" and "00x01," where the symbol "x" stands for the central symbol within the context. Following the first merge operation, the two contexts "00x00" and "00x01" are merged into a three-symbol context "00x0." Thus, the context tree, following the first merge operation, represents 14 4-symbol contexts and one 3-symbol context. The above described DUDE can be modified, for example, to employ occurrence-count vectors for symbols within variably sized contexts, with additional elements of the DUDE correspondingly modified to allow for computation of transfer functions for minimal distortion replacement of symbols in variably sized contexts rather than in fixed size contexts.

The fully pruned context tree, shown in FIG. 14B, can be used to generate 15 different variably sized context models, or variably sized metasymbol occurrence-count vectors $m(s_{noisy}b,c)$, using the notation employed in the above discussion of the DUDE. FIGS. 15A-E show a full, non-variably sized context model and four exemplary variably sized metasymbol occurrence-count vectors, or variably sized context models, generated by different numbers of sequential pruning steps from the fully balanced context tree shown in FIG. 14A. The full, non-variable-length context count vector is shown, in table form, in FIG. 15A. This represents the information contained in the 16 leaf nodes of the context tree shown in FIGS. 14A-B. Thus, for example, the full context represented by leaf node 1412, along with the symbol counts, is represented by row 1502 in the full, non-variably sized context model shown in FIG. 15A. FIG. 15B shows a variably sized context model generated by four iterations of the pruning method. This variably sized context model can be generated by a depth-first, left-to-right traversal of the context tree shown in FIG. 14B, in which the local search branch is terminated upon encountering a node with a merge number less than the desired number of iterative pruning steps. Thus, for example, the depth-first, left-to-right traversal of the context tree shown in FIG. 14B begins by traversing from node 1402 to node 1424. Node 1424 includes the merge number "11," a number greater than the desired number of sequential pruning steps, "4," and the search therefore continues with a second traversal from node 1424 to node 1426. In the case of node 1426, the included merge number "3" is less than the desired number of sequential pruning steps, "4," and thus node 1426 is a termination point, or leaf node, for the unbalanced context tree generated after four levels of sequential pruning. Node 1426 corresponds to the context {b=(0), c=(0)}, represented by row 1504 in the variably sized context model shown in tabular form in FIG. 15B. FIGS. 15C-E show the variably sized context models, or variably sized metasymbol occurrence-count vectors, for the unbalanced trees generated by eight, ten, and 12 sequential pruning steps, respectively.

This same sequential pruning technique can be applied to signals containing symbols chosen from alphabets of arbitrary size. The depth of the balanced context tree corresponding to an analyzed signal is equal to the total number of symbols in the considered contexts, and the number of children associated with each node, as well as the number of symbol counts within each node, is equal to the number of symbols in the alphabet. For example, if the example signal contained symbols chosen from the alphabet {0,1,2}, and a four-symbol context such as that used in the examples illustrated in FIGS. 13 and 14A-B is used, then the full, balanced context tree would include five levels, as in FIG. 14B, but with each node containing three different symbol-count values, and with non-leaf nodes each having three children.

Figure 16A:
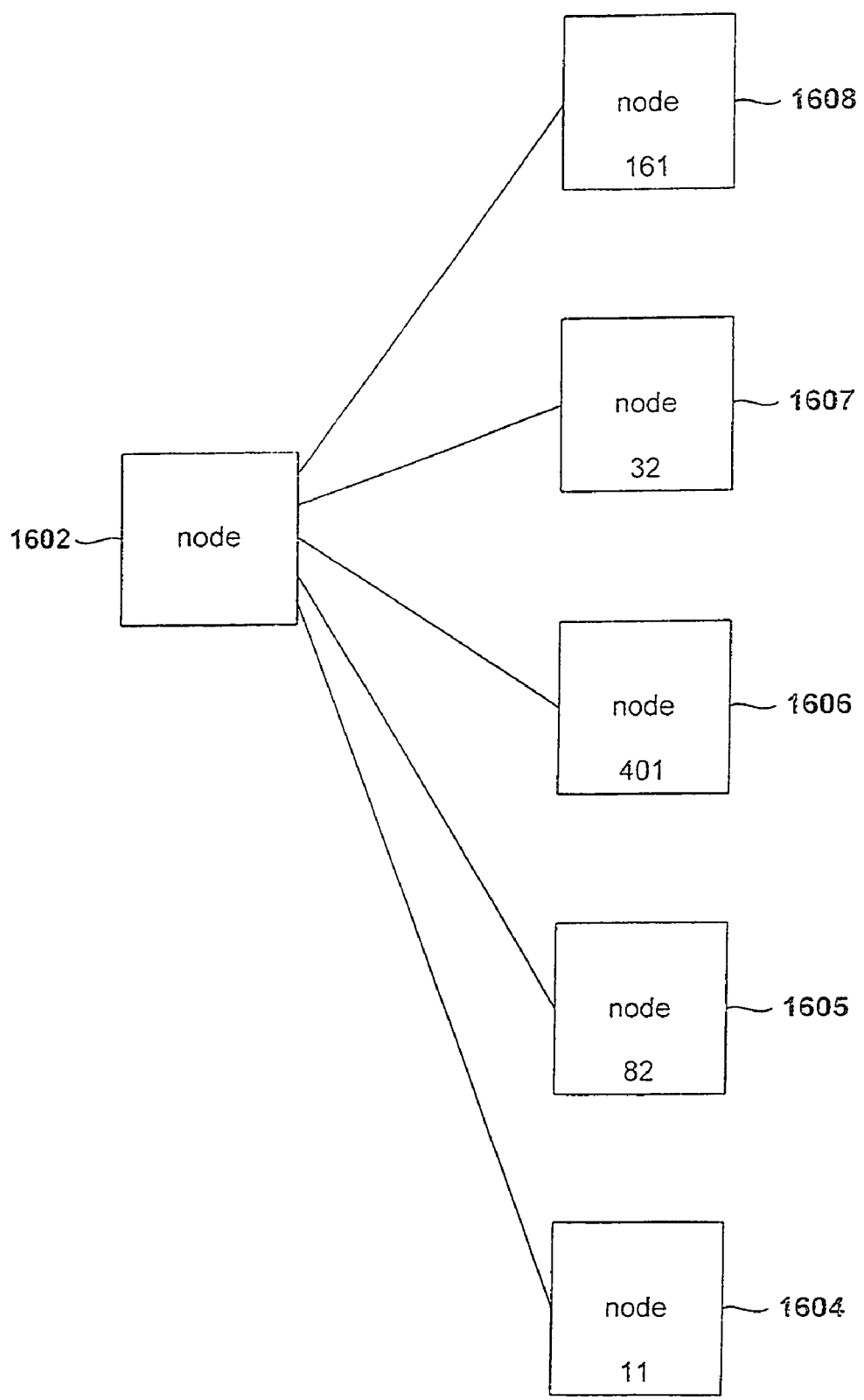
FIGS. 16A-C illustrate different types of merge metrics that may be employed in the context-tree pruning that represents a number of embodiments of the present invention.
Figure 16B:
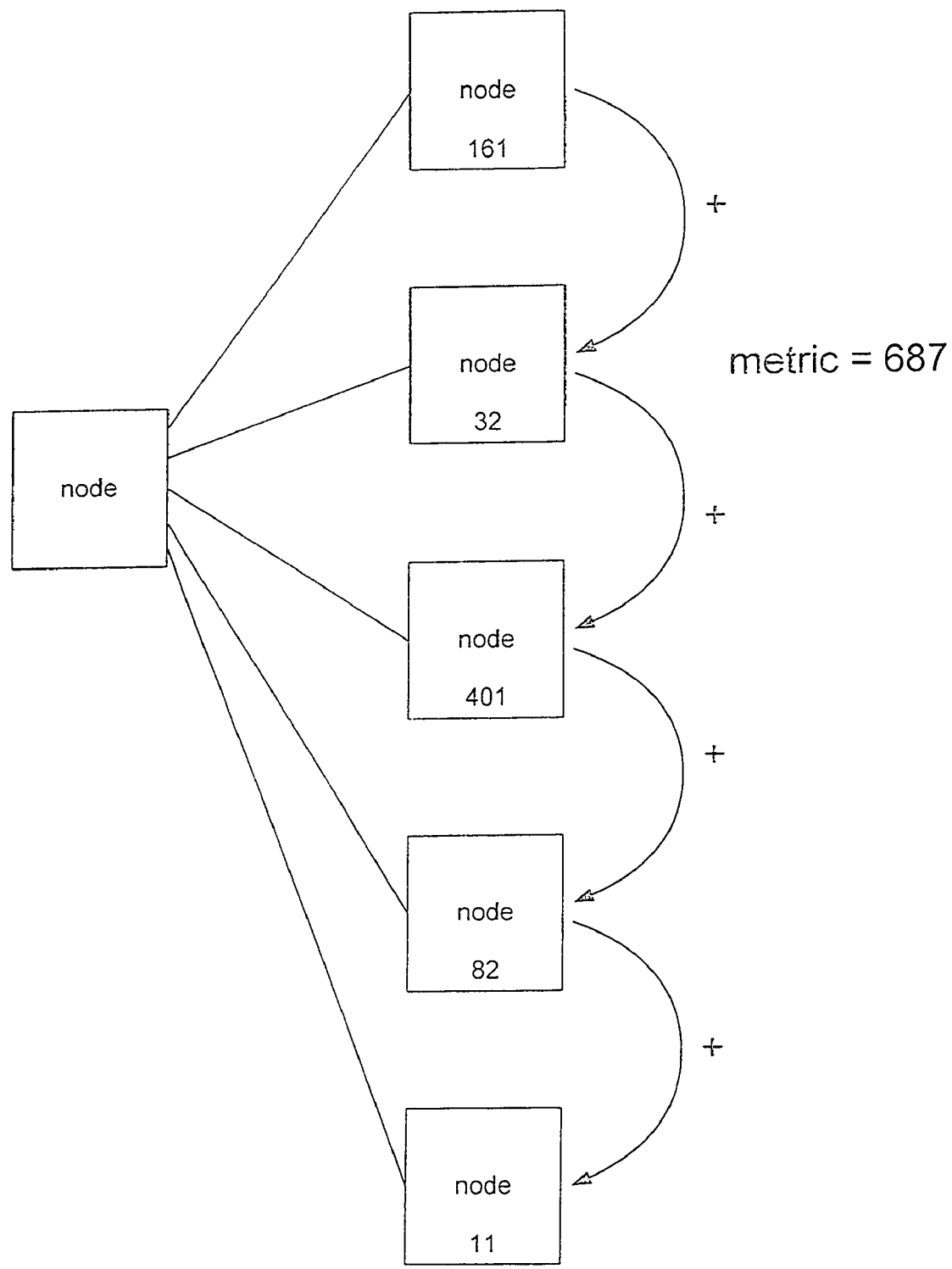
Figure 16C:
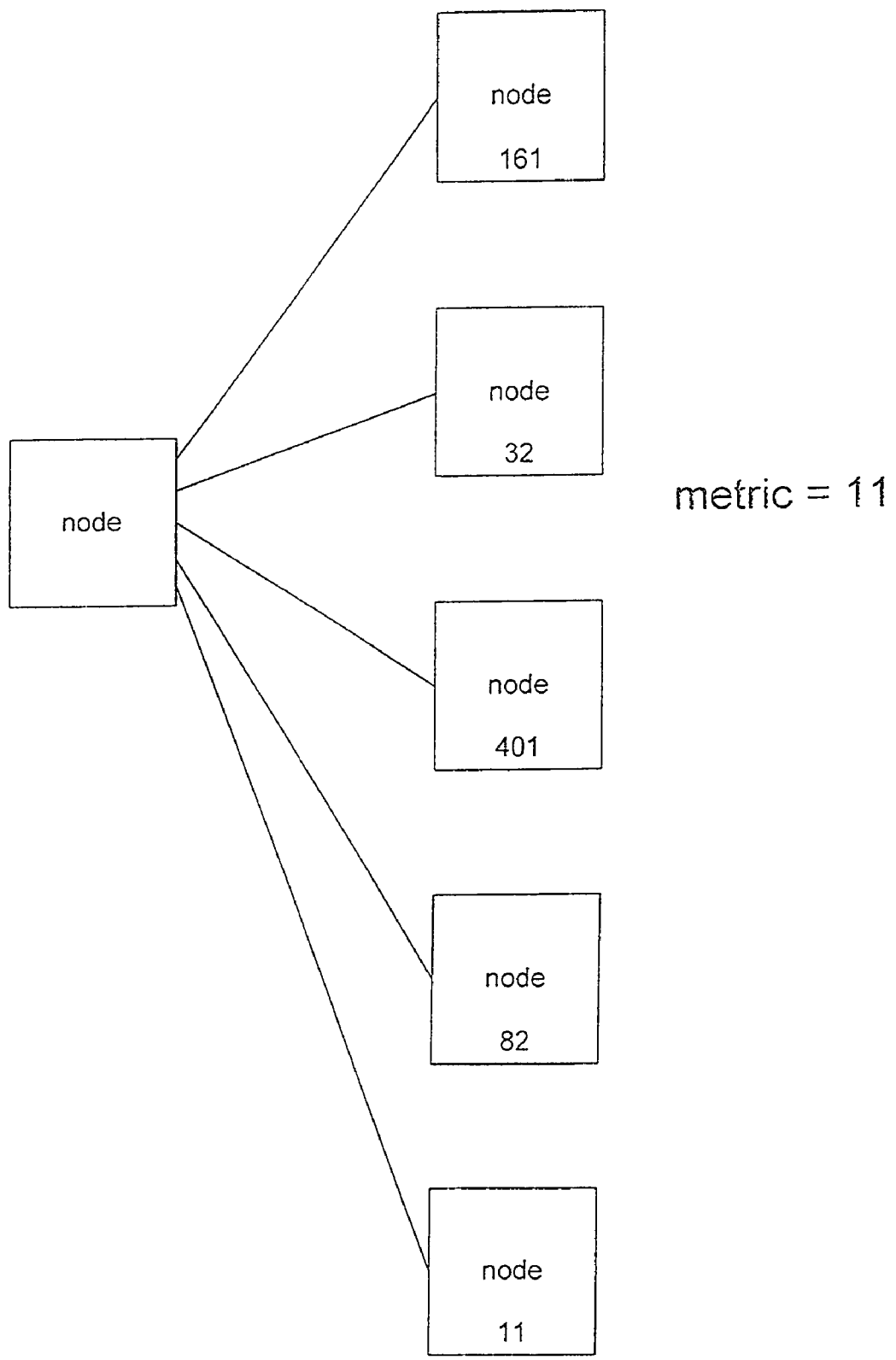

FIGS. 16A-C illustrate different types of merge metrics that may be employed in the context-tree pruning that represents a number of embodiments of the present invention. As shown in FIG. 16A, a particular context tree node 1602 for which a merge metric is to be computed may have a number of children nodes 1604-1608. Each child node is associated with an occurrence count. As shown in FIG. 16B, one possible merge metric is the sum of the occurrence counts of all the child nodes. In this case, the merge metric would have the value 687. The lower the merge metric associated with a node, the more favorable the node is for merging. Alternatively, as shown in FIG. 16C, a merge metric may simply be the lowest occurrence count of any of the child nodes. Again, as discussed above, the number of child nodes for a node within a context tree is equal to the number of symbols in an alphabet for the signal or data stream being considered. Additional types of merge metrics are possible. For example, a merge metric may take into account similarities between the symbol distributions for contexts that are candidates for merging. For example, for a pair of sibling nodes a and b in a binary symbol application, a merge metric can be defined as follows:

$$S_{a,b} = C_a D(P_a \| P_{a,b}) + C_b D(P_b \| P_{a,b})$$

where $C_a$ and $C_b$ denote the occurrence counts for nodes a and b, respectively, $P_a$ and $P_b$ denote empirical symbol probability distributions for symbols occurring in contexts corresponding to nodes a and b, $P_{a,b}$ denotes the empirical symbol probability distribution of the merged context, and $D(\Box \| \Box)$ denotes the Kullback-Leibler distance between distributions.

The sibling nodes with lowest score is selected for merging. In a n-symbol application, where all children of a node are merged, a suitable merge metric may be defined as:

$$S_{a_1, a_2, \ldots, a_n} = \sum_{i=1}^{n} C_{a_i} D(P_{a_i} \| P_{a_1, a_2, \ldots, a_n})$$

In the examples discussed, a binary alphabet is used, so that each node within a context tree has two children. When larger alphabets are used, a node merge may involved merging all of the children for a node, a k-wise merge, or more complex, intermediate pair-wise mergings may be carried out.

Next, a C++-like pseudocode implementation of a general context-tree-building-and-pruning program is provided. The following C++-like pseudocode implements a general context-tree-construction-and-pruning method for two-sided contexts in one-dimensional signals, as described above with reference to FIGS. 13-15. The following implementation, with slight alterations, can be used to build various variably-sized context models for signals of arbitrary length, initially using two-sided contexts of equal, but arbitrary lengths, where the symbols may be chosen from an alphabet of arbitrary size. It should be noted that the following pseudocode implementation is not intended to represent a most efficient or elegant approach, but is provided simply as an illustrative example. For example, the following implementation makes liberal use of recursion, but, for efficiency, most of the recursive routines can be straightforwardly replaced with non-recursive routines employing iteration. An almost limitless number of possible implementations are possible.

First, a small number of enumerations, type definitions, and constant declarations are provided:

1  enum MergeState {NOT_READY, ALREADY_MERGED, MERGEABLE};

2  enum PruneMetric {LeastSum, LeastCount};

3  typedef unsigned char symbol;

4  const int MaxAlphabetSize=4;

5  const int MaxK=5;

6  const int MaxContext=MaxK*2;

7  const int BIG_NUMBER=100000000;

The enumeration "MergeState" provides values indicating the merge state of nodes in a context tree. The enumeration values include: (1) NOT_READY, indicating the node's children have not yet been determined to all be leaf nodes; (2) ALREADY_MERGED, indicating that the node has been merged; and (3) MERGEABLE, indicating that the node is a candidate for merging. The enumeration "PruneMetric" indicates which of two possible merge metrics should be used for pruning: (1) "LeastCount," the smallest symbol count in a child node; or (2) "LeastSum," the smallest sum of symbol counts in children nodes. On line 3, above, the type "symbol" is declared as an unsigned character. Signal symbols are represented by monotonically increasing integers, starting with the symbol "0." On lines 4-6, various maximum values for parameters are declared as constants. This approach is used for simplicity. In alternative, more robust implementations, the data structures for holding symbol counts, contexts, and other entities may be dynamically allocated, obviating the need for these maximum value constants indicating the static sizes of various data structures. Finally, on line 7, the constant "BIG_NUMBER" is defined to be a large integer value.

Next, the class "node," an instance of which represents a node in a context tree, is declared as follows:

```
 1  class node
 2  {
 3    private:
 4      int metric;
 5      int mergeNum;
 6      int symbolCounts[MaxAlphabetSize];
 7      MergeState mergeState;
 8      node* kids[MaxAlphabetSize];
 9
10    public:
11      int getMetric( ) {return metric;};
12      void setMetric(int c) {metric = c;};
13      void addToMetric(int c) {metric += c;};
14      void incMetric( ) {metric++;};
15      int getSymbolCount(symbol s) {return symbolCounts[s];};
16      void setSymbolCount(symbol s, int c) {symbolCounts[s] = c;};
17      void addToSymbolCount(symbol s, int c) {symbolCounts[s] += c;};
18      void incSymbolCount(symbol s) {symbolCounts[s]++;};
19      int getMergeNum( ) {return mergeNum;};
20      void setMergeNum(int m) {mergeNum = m;};
21      MergeState getMergeState( ) {return mergeState;};
```

-continued

```
22      void setMergeState(MergeState m) {mergeState = m;};
23      void setKid(symbol s, node* kptr) {kids[s] = kptr;};
24      node* getKid(symbol s) {return kids[s];};
25      node(MergeState m);
26 };
```

An instance of the class "node" includes the following five data members: (1) "metric" declared above on line 4, containing the merge metric computed for the node; (2) "mergeNum," declared above on line 5, which stores the merge number that indicates the pruning iteration in which the node is merged; (3) "symbolCounts," an integer array storing the symbol counts for each symbol of the alphabet, essentially representing the number of times each symbol occurs within the context represented by the node; (4) "MergeState," which contains a merge state value indicating the merge state of the node during the pruning process; and (5) "kids," an array storing pointers to each child node. On lines 11-24, above, a number of in-line member functions are declared for retrieving, storing, and incrementing the values of the five data members, discussed above. Finally, on line 25, a constructor for the class "node" is declared.

Next, a declaration for the class "countTree" is provided as follows:

```
1  class countTree
2  {
3    private:
4      node* contextTree;
5      int k, k2;
6      int cSize;
7      int alphaSize;
8      symbol largestSymbol;
9      int numLvls;
10     int curLvl;
11     symbol path[MaxContext];
12     int    pathPtr;
13     int pathSize;
14     int lastPath;
15
16     void buildTree(int lvl, node* ptr);
17     void buildLeaves(int lvl, PruneMetric pm, node* ptr);
18     void clearTree(node* ptr);
19     bool pruneTree(node* ptr, PruneMetric pm, int & currentM,
20                    node** curNode);
21     bool incPath( );
22
23     int accumulateInitialize1( ) {return BIG_NUMBER;};
24     int accumulateInitialize2( ) {return 0;};
25     int accumulateNextNode1(int nxtCount, int currentCount)
26     {return (nxtCount < currentCount ? nxtCount : currentCount);};
27
28     int accumulateNextNode2(int nxtCount, int currentCount)
29     { return currentCount + nxtCount;};
30
31     void computeMergeMetric1(node* ptr);
32     void computeMergeMetric2(node* ptr);
33     void outputContextTreeLevel(node* ptr, int lvl, int curlvl);
34
35   public:
36     void buildContextTree(int contextSize, int alphabetSize);
37     void countSymbolsInContexts(char* cText);
38     void clearContextTree( );
39     void pruneContextTree(PruneMetric pm);
40     void initializeCountVector(int pruneLevel);
41     bool nextCountVector(char* b, char* c, int* counts);
42     void output( );
43     void outputContextTree( );
44     countTree( );
45  };
```

The class "countTree" encapsulates a context tree and various methods for constructing and pruning the context tree to generate various different variable-length-metasymbol-occurrence-count vectors, such as those shown in tabular form in FIGS. 15A-E. Private data members declared for the class "countTree" include: (1) "contextTree," declared above on line 4, a pointer to the root node of a balanced context tree; (2) "k" and "k2," declared above in line 5, containing the number of symbols in the left and right contexts and the total number of symbols in a two-sided context, respectively; (3) "cSize," declared above on line 6, which contains the total context size, including the considered, or central, symbol within the context; (4) "alphaSize," declared above on line 7, which contains the number of symbols in the alphabet from which a signal is generated; (5) "largestSymbol," declared above on line 8, which contains the numerical value for the largest symbol in the alphabet; (6) "numLvls," declared above on line 9, the number of sequential prunings carried out at a particular point in execution; (7) "curLvl," declared above on line 10, which contains the target pruning level desired for a traverse of the context tree to build a variably sized context model; (8) "path," declared above on line 11, which contains a context specifying a traversal from the root node to a leaf node of the context tree; and (9) "pathPtr," "pathSize," and "lastPath," declared above on lines 12-14, which specify the size of the current path and indexes into the current path used for traversing the context tree. The class "countTree," includes the private member functions: (1) "buildTree," declared above on line 16, a recursive function employed to construct a context tree; (2) "buildLeaves," declared above on line 17, a function that initializes the leaf nodes of the context tree; (3) "clearTree" declared above on line 18, a recursive function that de-allocates the nodes of a context tree; (4) "pruneTree," declared above on line 19, a recursive function which is employed to sequentially prune the context tree to generate the variably sized context models; (5) "incPath," declared above on line 21, which increments the current context path stored in the data member "path" during a context-tree traversal; (6) "accumulateInitialize1" and "accumulateInitialize2," declared above on lines 23-24, which initialize data members for subsequent calls to routines that find the next merge candidate among the non-merged nodes remaining in the context tree, two different routines employed to implement the two different types of merge metrics; (7) "accumulateNextNode1" and "accumulateNextNode2," declared above on lines 26-29, routines employed in searching for a next merge candidate; (8) "computerMergeMetric1" and "computeMergeMetric2," declared above on lines 31-32, which determine the next candidate merge node according to each of the two different types of merge metrics, computing merge metrics for nodes during the search of the context tree; and (9) "outputContextTreeLevel," a recursive routine for outputting context of a context-tree level, an implementation for which is not subsequently provided, in the interest of brevity. Finally, the class "countTree" includes the following public member functions: (1) "buildContextTree," declared above on line 36, which constructs a balanced, full context tree according to the context size and alphabet size, provided as arguments; (2) "countSymbolsInContext," declared above on line 37, which accumulates, in the leaf nodes of a context tree, metasymbol counts based on analysis of the signal supplied as argument "cText"; (3) "clearContextTree," declared above on line 38, which de-allocates and removes a constructed context tree; (4) "pruneContextTree," declared above on line 39, which sequentially prunes a constructed context tree to generate the variable-length-context sets for an analyzed signal; (5) "initializeCountVector," declared above on line 40, which initializes data structures used for generating a particular variable-length-context set; (6) "nextCountVector," declared above on line 41, which generates a variable-length metasymbol count vector; (7) several output member functions, declared above on lines 42-43, for which implementations are not provided, in the interest of brevity; and (8) "countTree," a constructor for the class "countTree."

An implementation of the constructor for the class "node" is next provided:

```
 1 node::node(MergeState m)
 2 {
 3    setMergeState(m);
 4    setMetric(0);
 5    setMergeNum(0);
 6    for (int i = 0; i < MaxAlphabetSize; i++)
 7    {
 8         setSymbolCount(i, 0);
 9         setKid(i, NULL);
10    }
11 }
```

The constructor for the class "node" simply initializes the various private data members. The initial values are either zero or null pointers, with the exception of the MergeState, which is supplied as argument "m."

Next, an implementation for the member function "buildTree" is provided:

```
 1 void countTree::buildTree(int lvl, node* ptr)
 2 {
 3    int cA;
 4    node* nptr;
 5
 6    if (lvl == (2*k) - 1)
 7    {
 8       for (cA = 0; cA < alphaSize; cA++)
 9       {
10          nptr = new node(ALREADY_MERGED);
11          ptr->setKid(cA, nptr);
12       }
13       return;
14    }
15    else
16    {
17       for (cA = 0; cA < alphaSize; cA++)
18       {
19          nptr = new node(NOT_READY);
20          ptr->setKid(cA, nptr);
21          buildTree(lvl + 1, nptr);
22       }
23    }
24 }
```

The function member "buildTree" is a simple recursive routine that descends through the levels of the context tree, constructing intermediate-level nodes in the for-loop of lines 17-22, and leaf nodes in the for-loop of lines 8-12. On line 6, buildTree determines whether or not the context-tree level immediately above the leaf-node level has been reached. If so, then buildTree constructs leaf nodes for the current node, assigning the leaf nodes the MergeState "ALREADY_MERGED," since leaf nodes cannot be merged during pruning. Otherwise, non-leaf nodes are constructed in the for-loop of lines 17-22 and assigned the initial MergeState "NOT_READY."

Next, an implementation for the function member "buildLeaves" is provided:

```
 1 void countTree::buildLeaves(int lvl, PruneMetric pm, node* ptr)
 2 {
 3    int cA;
 4    int acc = 0;
 5    int least = BIG_NUMBER;
 6    int nxtCount;
 7
 8    if (lvl == (2 * k))
 9    {
10       for (cA = 0; cA < alphaSize; cA++)
11       {
12          nxtCount = ptr->getSymbolCount(cA);
13          if (nxtCount < least) least = nxtCount;
14          acc += nxtCount;
15       }
16       if (pm == LeastCount) ptr->setMetric(least);
17       else ptr->setMetric(acc);
18       return;
19    }
20    else
21    {
22       for (cA = 0; cA < alphaSize; cA++)
23       {
24          buildLeaves(lvl + 1, pm, ptr->getKid(cA));
25       }
26    }
27 }
```

The function member "buildLeaves" is called after a signal has been analyzed and the symbol counts for each context accumulated within the leaf node representing that context. The member function "buildLeaves" computes the merge metric for each leaf node, from the stored symbol counts, and stores the computed metric in the leaf node.

Next, an implementation of the function member "buildContextTree" is provided:

```
 1 void countTree::buildContextTree(int contextSize, int alphabetSize)
 2 {
 3    contextTree = new node(NOT_READY);
 4    k = contextSize;
 5    k2 = k * 2;
 6    cSize = k2 + 1;
 7    alphaSize = alphabetSize;
 8    largestSymbol = alphaSize - 1;
 9    pathSize = k * 2;
10    lastPath = pathSize - 1;
11    buildTree(0, contextTree);
12 }
```

The function member "buildContextTree" initializes the various private members for the class "countTree" according to the desired context size and alphabet size supplied as arguments. Finally, on line 11, the function member "buildContextTree" calls the recursive function member "buildTree" to build a full, balanced context tree according to the context size and alphabet size specifications in the arguments.

Next, an implementation of the function member "countSymbolsInContext" is provided:

```
 1 void countTree::countSymbolsInContexts(char* cText)
 2 {
 3    int signalLen = strlen(cText);
 4    node* ptr;
 5    int i, j, mid;
 6
 7    if (signalLen < cSize) return;
```

```
 8    for (i = 0; i <= signalLen - cSize; i++)
 9    {
10      ptr = contextTree;
11      mid = i + k;
12      for (j = 1; j <= k; j++)
13      {
14        ptr = ptr->getKid(cText[mid - j] - '0');
15        ptr = ptr->getKid(cText[mid + j] - '0');
16      }
17      ptr->incSymbolCount(cText[mid] - '0');
18    }
19  }
```

The function member "countSymbolsInContext" carries out a left-to-right analysis of a signal, a pointer to which is provided as argument "cText," in order to count the occurrences of the different metasymbols within the signal or, in other words, the occurrences of symbols within particular contexts. The symbol counts stored within leaf nodes of the context tree are updated according to each newly detected context and central, or considered, symbol within the context. The leaf node corresponding to a context is found by traversing the context tree, in the for-loop of lines 12-16, in which a ping pong-type approached is employed to extract symbols alternatively from the left and right contexts in order to steer traversal of the context tree.

Next, an implementation of the function members "clearTree" and "clearContextTree" are provided, below, without additional comment:

```
 1  void countTree::clearTree(node* ptr)
 2  {
 3    int cA;
 4    node* nptr;
 5
 6    for (cA = 0; cA < alphaSize; cA++)
 7    {
 8      nptr = ptr->getKid(cA);
 9      if (nptr != NULL) clearTree(nptr);
10    }
11    delete ptr;
12  }
 1  void countTree::clearContextTree( )
 2  {
 3    clearTree(contextTree);
 4  }
```

Next, an implementation of the function member "computeMergeMetric1" is provided:

```
 1  void countTree::computeMergeMetric1(node* ptr)
 2  {
 3    node* nxt;
 4    int i, j, lCounts[MaxAlphabetSize];
 5    int acc = accumulateInitialize1( );
 6
 7    if (ptr->getMergeState( ) == ALREADY_MERGED)
 8      return;
 9    if (ptr->getMergeState( ) == MERGEABLE) return;
10    else
11    {
12      for (j = 0; j < alphaSize; j++) lCounts[j] = 0;
13      for (i = 0; i < alphaSize; i++)
14      {
15        nxt = ptr->getKid(i);
16        if (nxt->getMergeState( ) != ALREADY_MERGED)
17          return;
18        acc = accumulateNextNode1(nxt->getMetric( ), acc);
19
20        for (j = 0; j < alphaSize; j++) lCounts[j] +=
             nxt->getSymbolCount(j);
21      }
22      ptr->setMergeState(MERGEABLE);
23      ptr->setMetric(acc);
24      for (j = 0; j < alphaSize; j++) ptr->setSymbolCount(j, lCounts[j]);
25    }
26  }
```

The function member "computeMergeMetric1" determines the merge metric for a node pointed to by the argument "pointer," if possible. If the node has MergeState "ALREADY_MERGED" or "MERGEABLE," as detected on lines 7 and 9, then the merge metric has already been computed and stored in the node. Otherwise, in the for-loop of lines 13-21, the merge metric is computed for the node and stored in the node on line 23, if possible. On line 24, the symbol counts of all children nodes of the node are accumulated and stored as symbol counts for the newly merged node. Note that, if any of the children of the node are determined to not have already been merged, on line 16, then the node is not ready for merging, and the computation of the merge metric is aborted, on line 17. The function member "computeMergeMetric1" calls the function member "accumulateNextNode1" for accumulating the merge metric from the symbol counts of the children node. The function member "computeMergeMetric1" computes the merge metric as the smallest symbol count found in a child node, while the nearly identical function "computerMergeMetric2," next provided, computes the merge metric for a node as the sum of the symbol counts of the children:

```
 1  void countTree::computeMergeMetric2(node* ptr)
 2  {
 3    node* nxt;
 4    int i, j, lCounts[MaxAlphabetSize];
 5    int acc = accumulateInitialize2( );
 6
 7    if (ptr->getMergeState( ) == ALREADY_MERGED) return;
 8    if (ptr->getMergeState( ) == MERGEABLE) return;
 9    else
10    {
11      for (j = 0; j < alphaSize; j++) lCounts[j] = 0;
12      for (i = 0; i < alphaSize; i++)
13      {
14        nxt = ptr->getKid(i);
15        if (nxt->getMergeState( ) != ALREADY_MERGED)
16          return;
17        acc = accumulateNextNode2(nxt->getMetric( ), acc);
18        for (j = 0; j < alphaSize; j++) lCounts[j] +=
             nxt->getSymbolCount(j);
19      }
20      ptr->setMergeState(MERGEABLE);
21      ptr->setMetric(acc);
22      for (j = 0; j < alphaSize; j++) ptr->setSymbolCount(j, lCounts[j]);
23    }
24  }
```

Next, an implementation of the function member "pruneTree" is provided:

```
 1  bool countTree::pruneTree(node* ptr, PruneMetric pm, int &
       currentM,
```

```
2                    node** curNode)
3       {
4           int i;
5           node* nxt;
6           bool rVal = false;
7
8           if (ptr->getMergeState( ) == ALREADY_MERGED) return
            false;
9           if (ptr->getMergeState( ) == NOT_READY)
10          {
11              switch(pm)
12              {
13                  case LeastCount: computeMergeMetric1(ptr);
            break;
14                  case LeastSum: computeMergeMetric2(ptr);
15              }
16              if (ptr->getMergeState( ) != MERGEABLE)
17              {
18                  for (i = 0; i < alphaSize; i++)
19                  {
20                      nxt = ptr->getKid(i);
21                      if (pruneTree(nxt, pm, currentM, curNode))
                            rVal = true;
22                  }
23                  return rVal;
24              }
25          }
26          if (ptr->getMetric( ) < currentM)
27          {
28              *curNode = ptr;
29              currentM = ptr->getMetric( );
30              return true;
31          }
32          else return false;
33      }
```

The function member "pruneTree" searches the context tree in a depth-first, left-to-right recursive search to find the next node for merging. At each point in the search, if a node is encountered with a merge metric lower than the lowest merge metric already encountered, the newly encountered merge metric is stored in currentM and a pointer to the node is stored in curNode on lines 28-29.

Next, an implementation of the function member "pruneContextTree" is provided:

```
1   void countTree::pruneContextTree(PruneMetric pm)
2   {
3       node* ptr;
4       int currentMetric = BIG_NUMBER;
5       node* currentNode = NULL;
6       int pLvl = 0;
7
8       buildLeaves(0, pm, contextTree);
9       while (pruneTree(contextTree, pm, currentMetric, &ptr))
10      {
11          ptr->setMergeState(ALREADY_MERGED);
12          ptr->setMergeNum(++pLvl);
13          currentMetric = BIG_NUMBER;
14      }
15      numLvls = pLvl;
16  }
```

The function member "pruneContextTree" calls the function member "buildLeaves" on line 8, to initialize all leaf nodes, and then, in the while-loop of lines 9-14, repeatedly identifies a next node for merging via a call to function member "pruneTree" and merges that node on lines 11-13.

Next, an implementation of the function member "initializeCountVector" is provided:

```
1   void countTree::initializeCountVector(int pruneLevel)
2   {
3
4       if (pruneLevel > numLvls) curLvl = numLvls;
5       else if (pruneLevel < 0) curLvl = 0;
6       else curLvl = pruneLevel;
7
8       for(int i = 0; i <= pathSize; i++)
9       {
10          path[i] = 0;
11      }
12      pathPtr = pathSize;
13  }
```

The function member "initializeCountVector" initializes the array "path" to have all symbols values equal to "0," and initializes the data member "curLvl" to indicate the prune level, or sequential prune iteration, to be used for computing a next variable-context metasymbol count vector.

Next, an implementation of the function member "incPath" is provided:

```
1   bool countTree::incPath( )
2   {
3       int i;
4
5       for(i = pathPtr + 1; i < k2; i++) path[i] = 0;
6       i = pathPtr;
7       while (true)
8       {
9           if (i < 0) return false;
10          if (path[i] == largestSymbol) path[i--] = 0;
11          else
12          {
13              path[i]++;
14          break;
15          }
16      }
17      pathPtr = pathSize;
18      return true;
19  }
```

The function member "incPath" carries out a symbol-based increment of the path specified by the context stored in the array "path." Starting with a path containing all symbol values "0," the routine incPath generates, one-by-one, the contexts represented by each leaf node in sequence in a left-to-right traversal of the leaf-node level of the context tree.

Next, an implementation of the function member "nextCountVector" is provided:

```
1   bool countTree::nextCountVector(char* b, char* c, int* counts)
2   {
3       int i, j, bNum;
4       node* ptr = contextTree;
5       char* blnv;
6       bool left = true;
7
8       for (i = 0; i < pathSize; i++)
9       {
10          if (ptr->getMergeNum( ) > curLvl) ptr =
                ptr->getKid(path[i]);
11          else break;
12      }
13      if (i == 0) bNum = 0;
14      else bNum = (i − 1) / 2 + 1;
15      blnv = b + bNum;
```

```
-continued
16          *blnv-- = '\0';
17          for (j = 0; j < i; j++)
18          {
19              if (left) *blnv-- = '0' + path[j];
20              else *c++ = path[j] + '0';
21              left = !left;
22          }
23          *c = '\0';
24          for (j = 0; j < alphaSize; j++)
25          {
26              *counts++ = ptr->getSymbolCount(j);
27          }
28          pathPtr = i - 1;
29          return incPath( );
30      }
```

The function member "nextCountVector" traverses the pruned context tree to generate a next context and associated symbol counts for a variable-length metasymbol occurrence-count vector. In other words, each invocation of the function member "nextCountVector" generates a subsequent row in a variable-length metasymbol occurrence-count vector such as that shown in FIGS. 15A-E.

In the current implementation, the constructor for class "countTree" is empty:

```
1 countTree::countTree( )
2 {
3 }
```

Finally, a simple main routine is provided which generates the variable length metasymbol occurrence-count vector shown in table form in FIG. 15B.

not intended to suggest that that embodiment is most efficient by any particular set of efficiency criteria, or most suitable for a particular computational application. As discussed above, context trees may be pruned according to a large number of different merge metrics, including those discussed and implemented in the C++-like pseudocode. The mapping of contexts onto acyclic graphs may be carried out by many different schemes, leading to different variably sized context models. Many other merge metrics are possible. The merge metrics steer tree pruning in directions suitable for a particular computational application. As discussed above, variably sized context models may be employed in a wide variety of different applications, and may be suitably tailored for those applications.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A method, carried out on an electronic computer controlled by instructions of a computer program, for determining a variably sized context model from input signal data

```
1   int main(int argc, char* argv[ ])
2   {
3       countTree cT;
4       int i;
5
6       char cstream[100] = {
7           '1','1','1','1','1','1','1','1','1','1','1','1','1','1','1','0','0','0','1',
8           '1','1','0','1','1','1','1','1','0','1','1','1','1','1','1','0','1','1','0',
9           '1','1','0','0','1','1','1','1','1','1','1','0','1','1','1','1','1','1','1',
10          '1','1','1','0','1','1','1','1','1','1','1','1','1','1','1','1','0','0','1',
11          '1','1','0','0','1','1','1','1','1','1','1','1','1','1','1','1','0','\0',
12      };
13
14      cT.buildContextTree(2, 2);
15      cT.countSymbolsInContexts(cstream);
16      cT.pruneContextTree(LeastSum);
17      cT.initializeCountVector(4);
18      cT.output( );
19      return 0;
20  }
```

Although the present invention has been described in terms of a particular embodiment, it is not intended that the invention be limited to this embodiment. Modifications within the spirit of the invention will be apparent to those skilled in the art. For example, an almost limitless number of implementations of variably sized context model routines can be obtained for different computational applications, using different programming languages, control structures, modular organizations, etc. The above-provided C++-like pseudocode implementation is intended to illustrate one embodiment, but it is having symbols chosen from an alphabet having n symbols $\{a_1, a_2, \ldots, a_n\}$, the method comprising:
  counting, by the electronic computer, a number of occurrences of metasymbols in the input signal data formed by a context of K symbols and a currently considered symbol;
  preparing, by the electronic computer, a context tree, each node having n children, the context tree having leaf nodes, each leaf node associated with a particular context derived from a path of edges and nodes leading to the leaf node from a root node of the context tree;

pruning, by the electronic computer, the context tree by an ordered sequence of merge operations that each merges the children of a merge-candidate node; and storing, by the electronic computer, the pruned context tree in a computer-readable medium for subsequent use as the variably sized context model in one of a data-compression system, a data-prediction system, a digital-data denoising system, and another such data-processing system that transforms input data to output data using the variably sized context model.

2. The method of claim 1 wherein pruning the context tree by an ordered sequence of merge operations that each merges the children of a merge-candidate node further includes:

while the number of leaf nodes in the context tree is greater than a specified number of leaf nodes, selecting a merge-candidate having a most favorable merge metric;

merging the merge-candidate node by promoting sums of occurrence counts associated with each child node of the merge-candidate node to the merge-candidate node; and considering the merged merge-candidate node to be a leaf node of the context tree.

3. The method of claim 2 wherein selecting a merge-candidate having a most favorable merge metric further includes:

when a node of the context tree is not associated with a current merge metric, computing a merge metric for the node; and selecting a node having a current merge metric most favorably indicative of being next merged.

4. The method of claim 1 wherein the current merge metric for a node is one of:

a smallest occurrence count associated with a child of the node;

a sum of occurrence counts associated with the children of the node; and a merge metric based on similarities between empirical symbol probability distributions in contexts that are candidates for merging and an empirical symbol probability distribution in a merged context.

5. A variably sized context model, stored in a computer readable medium, prepared by a method for determining a variably sized context model comprising:

counting a number of occurrences of metasymbols in an input signal data formed by a context of K symbols and a currently considered symbol;

preparing a context tree, each node having n children, the context tree having leaf nodes, each leaf node associated with a particular context derived from a path of edges and nodes leading to the leaf node from a root node of the context tree;

pruning the context tree by an ordered sequence of merge operations that each merges the children of a merge-candidate node; and storing the pruned context tree in the computer-readable medium for subsequent use as the variably sized context model in one of a data-compression system, a data-prediction system, a digital-data denoising system, and another such data-processing system that transforms input data to output data using the variably sized context model.

6. A computer readable medium containing executable instructions which, when executed in a processing system, causes the system to perform a method for determining a variably sized context model by:

counting a number of occurrences of metasymbols in an input signal data formed by a context of K symbols and a currently considered symbol;

preparing a context tree, each node having n children, the context tree having leaf nodes, each leaf node associated with a particular context derived from a path of edges and nodes leading to the leaf node from a root node of the context tree;

pruning the context tree by an ordered sequence of merge operations that each merges the children of a merge-candidate node; and storing the pruned context tree in a computer-readable medium for subsequent use as the variably sized context model in one of a data-compression system, a data-prediction system, a digital-data denoising system, and another such data-processing system that transforms input data to output data using the variably sized context model.

7. A method, carried out on an electronic computer controlled by instructions of a computer program, for generating a variably sized context model from a fixed length context model expressed as a context tree of nodes, each node having n children, each child associated with a symbol of an alphabet having n symbols $\{a_1, a_2, \ldots, a_n\}$, the context tree having $n^K$ leaf nodes, each leaf node associated with a context and an occurrence count, and a root node, the method comprising:

determining, by the electronic computer, a number of desired leaf nodes;

while the number of leaf nodes in the context tree is greater than the desired number of leaf nodes, selecting, by the electronic computer, a next node to merge; and merging, by the electronic computer, the next node to merge, the merged node thereafter considered to be a leaf node; and storing, by the electronic computer, the context tree in a computer-readable medium for subsequent use as the variably sized context model in one of a data-compression system, a data-prediction system, a digital-data denoising system, and another such data-processing system that transforms input data to output data using the variably sized context model.

8. The method of claim 7 wherein selecting a next node to merge further includes:

evaluating each node by obtaining for the node a merge metric; and selecting as the next node to merge the node with a most favorable merge-metric value.

9. The method of claim 8 wherein most favorable merge-metric value is a lowest merge-metric value and obtaining for the node a merge metric further includes:

obtaining a merge-metric value associated with the node by a previous computation.

10. The method of claim 8 wherein most favorable merge-metric value is a lowest merge-metric value and obtaining for the node a merge metric further includes:

obtaining the merge-metric as the lowest occurrence count associated with any child of the node, when all children are leaf nodes, and otherwise indicating the node to be not ready for merging.

11. The method of claim 8 wherein most favorable merge-metric value is a lowest merge-metric value and obtaining for the node a merge metric further includes:

obtaining the merge-metric as the sum of occurrence counts associated with the children of the node, when all children are leaf nodes, and otherwise indicating the node to be not ready for merging.

12. The method of claim 8 wherein most favorable merge-metric value is a lowest merge-metric value and obtaining for the node a merge metric further includes:

obtaining the merge-metric S as $$S_{a_1, a_2, \ldots, a_n} = \sum_{i=1}^{n} C_{a_i} D(P_{a_i} \| P_{a_1, a_2, \ldots, a_n})$$

where
- $C_{a_i}$ denotes the occurrence count for symbol $a_i$ in each child context,
- $P_{a_i}$ denotes an empirical symbol probability distribution for symbol $a_i$ in each child context,
- $P_{a_1, a_2, \ldots, a_n}$ denotes an empirical symbol probability distribution of the merged context, and
- $D(\bullet\|\bullet)$ denotes the Kullback-Leibler distance between distributions when all children are leaf nodes, and otherwise indicating the node to be not ready for merging.

13. The method of claim 8 wherein merging the next node to merge further includes associating with the next node to merge an occurrence count equal to the sum of the occurrence counts associated with the children nodes of the next node to merge.

14. The method of claim 7 employed within a discrete denoiser to computer minimal-distortion replacement of symbols within variably sized contexts.

15. A variably sized context model, stored in a computer readable medium, prepared by a method for generating a variably sized context model comprising:

determining a number of desired leaf nodes;

while the number of leaf nodes in a context tree is greater than the desired number of leaf nodes,
  selecting a next node to merge; and
  merging the next node to merge, the merged node thereafter considered to be a leaf node; and storing the pruned context tree in the computer-readable medium for subsequent use as the variably sized context model in one of a data-compression system, a data-prediction system, a digital-data denoising system, and another such data-processing system that transforms input data to output data using the variably sized context model.

16. A computer readable medium containing executable instructions which, when executed in a processing system, causes the system to perform a method for generating a variably sized context model comprising:

determining a number of desired leaf nodes;

while the number of leaf nodes in a context tree is greater than the desired number of leaf nodes,
  selecting a next node to merge; and
  merging the next node to merge, the merged node thereafter considered to be a leaf node; and storing the pruned context tree in a computer-readable medium for subsequent use as the variably sized context model in one of a data-compression system, a data-prediction system, a digital-data denoising system, and another such data-processing system that transforms input data to output data using the variably sized context model.

* * * * *

UNITED STATES PATENT AND TRADEMARK OFFICE
CERTIFICATE OF CORRECTION

PATENT NO. : 7,624,009 B2 Page 1 of 1
APPLICATION NO. : 10/933793
DATED : November 24, 2009
INVENTOR(S) : Seroussi Gadiell et al.

It is certified that error appears in the above-identified patent and that said Letters Patent is hereby corrected as shown below:

In column 29, line 18, in Claim 12, delete "D(· || ·)" and insert -- D(□ || □) --, therefor.

Signed and Sealed this

Twentieth Day of April, 2010

David J. Kappos
*Director of the United States Patent and Trademark Office*